(12) United States Patent
Jauhiainen et al.

(10) Patent No.: US 12,460,292 B2
(45) Date of Patent: Nov. 4, 2025

(54) ATOMIC LAYER DEPOSITION APPARATUS AND A METHOD

(71) Applicant: BENEQ OY, Espoo (FI)

(72) Inventors: Mika Jauhiainen, Espoo (FI); Pekka Soininen, Espoo (FI)

(73) Assignee: BENEQ OY, Espoo (FI)

( * ) Notice: Subject to any disclaimer, the term of this patent is extended or adjusted under 35 U.S.C. 154(b) by 141 days.

(21) Appl. No.: 18/248,424

(22) PCT Filed: Oct. 11, 2021

(86) PCT No.: PCT/FI2021/050672
§ 371 (c)(1),
(2) Date: Apr. 10, 2023

(87) PCT Pub. No.: WO2022/079350
PCT Pub. Date: Apr. 21, 2022

(65) Prior Publication Data
US 2023/0392256 A1    Dec. 7, 2023

(30) Foreign Application Priority Data

Oct. 12, 2020   (FI) ..................................... 20206000

(51) Int. Cl.
C23C 16/44         (2006.01)
C23C 16/455        (2006.01)
C23C 16/458        (2006.01)

(52) U.S. Cl.
CPC .... *C23C 16/4412* (2013.01); *C23C 16/45551* (2013.01); *C23C 16/45563* (2013.01); *C23C 16/4584* (2013.01)

(58) Field of Classification Search
None
See application file for complete search history.

(56) References Cited

U.S. PATENT DOCUMENTS 8,025,732 B2 * 9/2011 Sakurai ............... H01L 21/6708
                                                    118/725
8,062,471 B2 * 11/2011 Mikhaylichenko .........
                                              H01L 21/67023
                                                    219/390
2013/0001330 A1 * 1/2013 Huang .............. C23C 16/45574
                                                    118/712

(Continued)

FOREIGN PATENT DOCUMENTS

CN    104233226 A    12/2014

OTHER PUBLICATIONS

International Search Report issued by the Finnish Patent and Registration Office acting as the International Searching Authority in relation to International Application No. PCT/FI2021/050672 dated Feb. 14, 2022 (4 pages).

(Continued)

*Primary Examiner* — Sylvia Macarthur
(74) *Attorney, Agent, or Firm* — CARTER, DELUCA & FARRELL LLP

(57) ABSTRACT

An atomic layer deposition apparatus includes a substrate support having a support surface, a precursor supply head having an output face, and a rotating mechanism arranged to rotate the substrate support and the precursor supply head relative to each other. The apparatus further includes a process chamber provided with a discharge connection for discharging gases from the process chamber.

16 Claims, 13 Drawing Sheets

(56) References Cited

U.S. PATENT DOCUMENTS

| | | | |
|---|---|---|---|
| 2015/0203965 A1 | 7/2015 | Enomoto et al. | |
| 2015/0361553 A1 | 12/2015 | Murakawa | |
| 2016/0153085 A1 | 6/2016 | Ueda | |
| 2017/0067156 A1 | 3/2017 | Leeser | |
| 2017/0183779 A1 | 6/2017 | Ikegawa et al. | |
| 2018/0142350 A1 | 5/2018 | Fukiage et al. | |
| 2018/0366315 A1* | 12/2018 | Hane | H01L 21/0228 |
| 2019/0109036 A1 | 4/2019 | Yudovsky | |
| 2019/0136377 A1 | 5/2019 | Honma et al. | |
| 2020/0149168 A1 | 5/2020 | Honma | |
| 2023/0023764 A1* | 1/2023 | Groechel | C23C 16/4586 |
| 2023/0374658 A1* | 11/2023 | Soininen | C23C 16/45576 |
| 2023/0392256 A1* | 12/2023 | Jauhiainen | H01L 21/6838 |

OTHER PUBLICATIONS

Written Opinion of the International Searching Authority issued by the Finnish Patent and Registration Office acting as the International Searching Authority in relation to International Application No. PCT/FI2021/050672 dated Feb. 14, 2022 (7 pages).

Finnish Search Report issued by the Finnish Patent and Registration Office in relation to Finnish Application No. 20206000 dated May 24, 2021 (2 pages).

\* cited by examiner

ATOMIC LAYER DEPOSITION APPARATUS AND A METHOD

CROSS-REFERENCE TO RELATED APPLICATIONS

This application is a national phase entry under 35 U.S.C. 371 of PCT International Application No. PCT/FI2021/050672 filed Oct. 11, 2021, which claims priority to Finnish Patent Application No. 20206000, filed Oct. 12, 2020, the disclosure of each of these applications is expressly incorporated herein by reference in their entirety.

FIELD OF THE INVENTION

The present invention relates to an atomic layer deposition apparatus. The present invention also relates to a method for processing a surface of a substrate.

BACKGROUND OF THE INVENTION

Manufacturing or coating substrates and especially planar substrates such as semiconductor wafers, with atomic layer deposition high throughput and high quality of formed thin films are important. However, in prior art devices the high throughput, or processing speed, of the apparatus and high coating quality are often contradictory relative each other. This means that increasing the throughput of the apparatus the coating quality is compromised. On the other hand, achieving high coating quality requires lowering the throughput of the apparatus.

Prior art atomic layer deposition apparatuses comprise solution in which a rotating substrate support is used. One or more substrates are supported on a support surface of the substrate surface. A precursor supply head is positioned opposite the substrate support such that an output face of the precursor supply head is arranged opposite and parallel to the support surface of the substrate support. A reaction gap is provided between the support surface and the output face. Precursor material or materials are supplied via the output face towards the support surface to which the one or more substrates are supported for subjecting the surface of the substrate to precursors. The output face comprises one or more reaction zones or precursor nozzles via which the precursors are supplied towards the support surface and the substrate. The substrate support is rotated around a rotating axis which is perpendicular to the support surface. When the substrate support is rotated, the one or more substrates move successively and repeatedly under the one or more reaction zone or precursor nozzles thus subjecting the surface if the substrate to precursors.

In the prior apparatuses, the loading and unloading of substrates to and from the substrate support is carried out from above such that the precursor supply head is moved or removed from the position in which is during processing. Moving or removing the precursor supply head is complicated task and time consuming decreasing throughput of the apparatus. Furthermore, the reaction gap between the between the support surface and the output face needs to be adjusted during after the loading of new substrates.

In the prior art apparatuses disclosed above, throughput is increased by increasing the rotating speed substrate support such that the substrate travels at increased velocity under and past the reaction zones or precursor nozzles of the precursor supply head. However, in the prior art apparatuses the quality of the coating deteriorates when the rotating speed is increased. This caused by the precursor gas flow from the reaction zone or the precursor nozzle tends to start following the rotating movement of the substrate support or the rotating substrate support drags the precursor along. Accordingly, the precursor material escapes from the reaction zone. This may further cause the different precursor to mix in reaction chamber surrounding the substrate support. Gas phase precursor reaction may occur instead of surface reaction on the surface of the substrate. The gas phase precursor reactions are prevented by arranging a very powerful suction or discharge flow to the reaction chamber. However, this may cause disturbance to the much smaller precursor flow.

BRIEF DESCRIPTION OF THE INVENTION

An object of the present invention is to provide an atomic layer deposition apparatus and a method such that the prior art disadvantages are solved or at least alleviated.

The preferred embodiments of the invention are disclosed in the dependent claims.

In the context of this application atomic layer deposition (ALD) means a deposition technique in which at least part of a surface of a substrate is subjected cyclically to alternating surface reactions of at least a first and second gaseous precursors. ALD comprises pure atomic layer deposition in which the surface reactions of the at least first and second precursors are saturated surface reactions. ALD also comprises partial surface reactions in which only part of the surface of the substrate is subjected to surface reactions of the at least first and second precursors. Thus, under dosing may be used for carrying out the ALD process. Furthermore, in the ALD process part of the reactions may occur in gas phase over the surface of the substrate. Thus, over dosing may also be used for carrying out the ALD process.

The invention is based on the idea of providing an atomic layer deposition apparatus for processing a surface of a substrate successively with at least a first precursor and a second precursor according to principles of atomic layer deposition. The apparatus comprises a substrate support having a support surface. The support surface is provided with one or more substrate holders for supporting one or more substrates. The apparatus further comprises a precursor supply head having an output face. The output face is provided with at least one reaction zone comprising a precursor supply zone open to the output face of the precursor supply head and arranged to supply precursor. The support surface of the substrate support and the output face of the precursor supply head is arranged opposite to each other such that a reaction gap is provided between the support surface of the substrate support and the output face of the precursor supply head. The apparatus also comprises a moving mechanism and a process chamber. The substrate support and the precursor supply head are arranged to be rotated relative to each other with the moving mechanism such that the support surface of the substrate support and the output face of the precursor supply head are arranged to be rotated relative to each other. The process chamber comprises chamber walls forming a chamber space inside the process chamber. The substrate support and the precursor supply head are arranged inside the process chamber.

The at least one reaction zone of the precursor supply head further comprises a suction zone open to the output face of the precursor supply head for discharging gases from the reaction gap between the support surface of the substrate support and the output face of the precursor supply head.

The suction zone prevents precursors flowing to unwanted regions and to other reaction zones in the reaction gap. Thus, gas phase mixing of precursors may be prevented and the coating quality may be increased.

The process chamber is further provided with a discharge connection open to the chamber space for discharging gases from the chamber space of the process chamber.

The discharge connection enables providing further underpressure to the chamber space of the process chamber and discharge gases from the chamber space.

According to the above mentioned, the suction zone directs a suction force to the upper side or upper surface of the substrate supported to the substrate holder of the substrate support as the substrate travels past the reaction zone in the reaction gap when the substrate support and the precursor supply head are rotated relative to each other. The suction zone provided in connection with the reaction zone enables providing a controlled reaction zone in which the surface of the substrate may be subjected to precursor via the precursor supply zone in controlled manner within the process chamber. Further, the discharge connection directs suction and thus flow away from the reaction gap preventing mixing of gases in the reaction gap.

In one embodiment of the present invention, the substrate support comprises a back surface opposite the support surface. The one or more substrate holders comprising a through hole extending through the substrate support between the back surface and the support surface.

The through hole extends between the support surface and the back surface of the substrate support. The through hole is open to the support surface and to the reaction gap between the support surface and the output face. The through hole is open to the chamber space process chamber.

The through hole is arranged to extend between the reaction gap and the chamber space.

The through hole provided to the substrate holders enables automated loading and unloading of substrates to and from the substrate support as the substrates may be lifted from below via the through hole from the support surface and from the substrate holder.

Due to the through hole of the substrate support in the substrate holder there is a risk that the substrate may detach or lift from the substrate support by the suction forced of the suction zone in the reaction gap. If the substrate moves or becomes detached from the substrate holder the substrate and also the apparatus may be damaged. The discharge connection enables providing an underpressure to the chamber space surrounding the substrate support. The underpressure acts on the lower side or lower surface of the substrate via the through hole of the substrate holder. Accordingly, the underpressure directs a discharge force to the lower side or lower surface of the substrate via the through hole of the substrate holder by the discharge connection holding the substrate in place in the substrate holder. Thus, moving or detaching of the substrate from the substrate holder may be prevented.

In one embodiment or in any of the embodiments of the present invention, the output face of the precursor supply head and the support surface of the substrate support are arranged parallel to each other such that a uniform reaction gap is provided between the support surface of the substrate support and the output face of the precursor supply head.

In one embodiment, the one or more substrate holders are formed as substrate holder recesses to the support surface.

The recess enables arranging the substrate to the support surface such that upper surface of a planar substrate is flush with the support surface. Thus, coating quality may be enhanced with good flow dynamics.

In an alternative embodiment, the one or more substrate holders are formed as substrate holder recesses to the support surface. The through hole is arranged to extend from the substrate holder recess to the back surface of the substrate holder. Thus, the substrate may be kept flush with the support surface in the recess with the underpressure from the discharge connection via the through hole.

The one or more through holes are open to the support surface of the substrate support and to the back surface of the substrate support. According, the one or more through holes extend between the support surface and the back surface of the substrate support.

Further, the one or more through holes are open to the reaction gap and to the chamber space. The one or more through holes are arranged extend between the reaction gap and the chamber space of the process chamber.

In one embodiment, the suction zone is arranged to surround the precursor supply zone at the output face of the precursor supply head.

In an alternative embodiment, the suction zone is arranged to surround the precursor supply zone circumferentially at the output face of the precursor supply head.

In a yet alternative embodiment, the suction zone is provided as a suction slot arranged to surround the precursor supply zone circumferentially at the output face of the precursor supply head.

The suction zone surrounding the precursor supply zone enables preventing precursor from escaping from the precursor supply zone in all directions in the reaction gap.

In one embodiment, the apparatus comprises a suction device connected to the suction zone of the at least one reaction zone. The suction device is arranged to provide suction to the reaction gap between the between the support surface of the substrate support and the output face of the precursor supply head. The suction device may be a vacuum pump, a suction pump or the like device arranged to provide suction or underpressure.

In one embodiment, the apparatus comprises a first reaction zone provided with a first suction zone and a first suction device connected to the first suction zone of the first reaction zone. The first suction device is arranged to provide suction to the reaction gap between the between the support surface of the substrate support and the output face of the precursor supply head via the first reaction zone. The apparatus further comprises a second reaction zone provided with a second suction zone and a second suction device connected to the second suction zone of the second reaction zone. The second suction device is arranged to provide suction to the reaction gap between the between the support surface of the substrate support and the output face of the precursor supply head via the second reaction zone.

Therefore, the precursor supply head comprises separate first and second reaction zones connected to separate first and second suction devices. Thus, the first and second suction zones may be operated independently with the first and second suction devices such that the discharged precursors may be kept separate from each other.

In an alternative embodiment, the first suction zone of the first reaction zone and the second suction zone of the second reaction zone are connected to a common suction device.

In this embodiment, a first suction connection between the common suction device and the first suction zone is provided with a first suction control valve. Similarly, a second suction connection between the common suction device and the second suction zone is provided with a second suction control valve. Thus, the suction via the first and second suction zones may be controlled independently by adjusting the first and second suction control valves.

In one embodiment, the reaction zone further comprises a purge gas supply zone open to the output face of the precursor supply head and arranged to surround the suction zone and the precursor supply zone circumferentially at the output face of the precursor supply head. The suction zone is arranged between the precursor supply zone and the purge gas supply zone at the output face of the precursor supply head.

In an alternative embodiment, the reaction zone further comprises a purge gas supply zone open to the output face of the precursor supply head and formed as a purge gas slot. The purge gas supply zone is arranged to surround the suction zone and the precursor supply zone circumferentially at the output face of the precursor supply head. The suction zone is arranged between the precursor supply zone and the purge gas supply zone at the output face of the precursor supply head.

The purge gas zone provides gas barrier around the suction zone and the precursor supply zone preventing precursor from escaping from the precursor supply zone in the reaction gap.

In one embodiment, the discharge connection is connected to a discharge device. The discharge device is arranged to provide suction to the chamber space of the process chamber via the discharge connection.

Accordingly, the suction or underpressure provided via the discharge connection is generated separately from the suction zone(s) of the precursor supply head.

In an alternative embodiment, the discharge connection is connected to the suction device. The suction device is arranged to provide suction to the chamber space of the process chamber via the discharge connection.

In one embodiment, the suction device is the common suction device to with the first and/or second suction connections and the discharge connection are connected.

In this embodiment, the discharge connection is provided with a discharge control valve. Thus, the suction via the discharge connection and the first and/or second suction zones may be controlled independently by adjusting the discharge control valve and first and/or second suction control valves.

In one embodiment, the discharge connection is provided to the chamber walls of the process chamber and arranged open to the chamber space.

In another embodiment, the process chamber comprises a bottom wall and one or more side walls extending from the bottom wall. The discharge connection is provided to the bottom wall of the process chamber and arranged open to the chamber space.

In a further embodiment, the process chamber comprises a bottom wall and one or more side walls extending from the bottom wall. The discharge connection is provided to one of the one or more side walls of the process chamber and arranged open to the chamber space.

Accordingly, the discharge connection provides suction or underpressure to the chamber space outside the reaction gap.

In one embodiment, the substrate support is arranged in vertical direction below the precursor supply head in the process chamber, and the discharge connection is provided below the support surface of the substrate support inside the process chamber.

In an alternative embodiment, the substrate support is arranged in vertical direction below the precursor supply head in the process chamber, and the discharge connection is provided to the bottom wall of the process chamber and below the support surface of the substrate support inside the process chamber.

In a further embodiment, the substrate support is arranged in vertical direction below the precursor supply head in the process chamber, and the discharge connection is provided in vertical direction between the support surface of the substrate support and the bottom wall of the process chamber inside the process chamber.

Providing the discharge connection below the substrate support and the substrate holder, the underpressure may be directed directly from the below to the back side or back surface of the substrate via the through hole. Thus, retaining the substrate in place during processing is further enhanced. The discharge connection or the discharge opening is arranged below the substrate support in the processing position of the substrate support.

In one embodiment, the discharge connection is open to the chamber space outside the reaction gap.

In an alternative embodiment, the apparatus comprises a substrate processing unit. The substrate processing unit comprises the substrate support, the precursor supply head and the reaction gap between the support surface of the substrate support and the output face of the precursor supply head. The process chamber comprises an intermediate chamber space surrounding the substrate processing unit inside the chamber space of the process chamber. The discharge connection is open to the intermediate chamber space.

In an alternative embodiment, the apparatus comprises a substrate processing unit. The substrate processing unit comprises the substrate support, the precursor supply head and the reaction gap between the support surface of the substrate support and the output face of the precursor supply head. The process chamber comprises an intermediate chamber space surrounding the substrate processing unit inside the chamber space of the process chamber. The discharge connection is open to the intermediate chamber space in vertical direction below the substrate processing unit.

The discharge connection or the discharge opening is arranged below the substrate processing unit in the processing position of the substrate support.

The one or more through holes are open to the support surface of the substrate support and to the back surface of the substrate support. According, the one or more through holes extend between the support surface and the back surface of the substrate support.

Further, the one or more through holes are open to the reaction gap and to the intermediate chamber space. Thus, the one or more through holes extend between the reaction gap and the intermediate chamber space.

The discharge connection comprises a discharge opening which is open to the intermediate chamber space and preferable open to the intermediate chamber space below the substrate support or below the support surface of the substrate support.

The discharge opening is arranged below the substrate support or the support surface in the processing position of the substrate support.

In one embodiment, the apparatus comprises a suction pressure sensor arranged in connection with the reaction gap for measuring pressure in the reaction gap between the support surface of the substrate support and the output face of the precursor supply head. The apparatus further comprises a discharge pressure sensor arranged in connection with the chamber space outside the reaction gap for measuring pressure in the chamber space outside the reaction gap.

The suction pressure sensor and the discharge pressure sensor enable measuring pressure inside the reaction gap and in the chamber space outside the reaction gap. Accordingly, the suction force from the suction zone(s) of the reaction zone(s) and the discharge force of the discharge connection may be adjusted in relation to each other by measuring the pressure in the reaction gap and in the chamber space outside the reaction gap.

In another embodiment, the suction zone is connected to a suction connection for discharging gases from the reaction gap. The suction connection is provided with a suction pressure sensor for measuring suction via the suction zone. The discharge connection is provided a discharge pressure sensor for measuring discharge via the discharge connection Accordingly, the suction force from the suction zone of the reaction zone and the discharge force of the discharge connection may be adjusted in relation to each other by measuring the pressure in the suction connection and in the discharge connection.

In an alternative embodiment, the first suction zone is connected to a first suction connection for discharging gases from the reaction gap. The first suction connection is provided with a first suction pressure sensor for measuring suction via the first suction zone. The second suction zone is connected to a second suction connection for discharging gases from the reaction gap. The second suction connection is provided with a second suction pressure sensor for measuring suction via the second suction zone. Further, the discharge connection is provided a discharge pressure sensor for measuring discharge via the discharge connection.

Accordingly, the suction force from the first and second suction zones of the first and second reaction zones and the discharge force of the discharge connection may be adjusted in relation to each other by measuring the pressure in the suction connection and in the discharge connection.

Preferably, the discharge force or discharge underpressure is arranged greater than the suction force of the suction zone or the first and second suction zones.

Greater underpressure means that the suction via discharge connection is greater than the suction via the suction zone(s). Thus, the pressure in the chamber space or in the intermediate chamber is lower than in the reaction gap.

In one embodiment, the moving mechanism is connected to the substrate support and arranged to rotate substrate support.

In an alternative embodiment, the moving mechanism is connected to the precursor supply head and arranged to rotate the precursor supply head.

Rotating the substrate support is preferable so that gas connections of the precursor supply head are not rotated.

In one embodiment, the moving mechanism is arranged to move the substrate support and the precursor supply head relative to each other in direction transverse to the support surface of the substrate support such that the reaction gap between the support surface and the output surface is adjusted.

In an alternative embodiment, the moving mechanism is arranged to move the substrate support in direction transverse to the support surface of the substrate support such that the reaction gap between the support surface and the output surface is adjusted.

In a further embodiment, the moving mechanism is arranged to move the precursor supply head in direction transverse to the support surface of the substrate support such that the reaction gap between the support surface and the output surface is adjusted.

The moving mechanism may be arranged to move the substrate support and the precursor supply head towards each other and away from each other such that height of the reaction gap may be altered. Thus, a loading and unloading position of the substrate support may be provided. In the loading and unloading position the support surface and the output face are a first distance from each other. Further, a processing position of the substrate support may also be provided. In the processing position the support surface and the output face are a second distance from each other, the second distance being smaller than the first distance.

The moving mechanism may be arranged to provide the rotation and transfer movement of the substrate support relative to the precursor supply head. Alternatively, the moving mechanism may comprise a separate rotating mechanism arranged to provide the rotation of the substrate support relative to the precursor supply head, and a separate transfer moving mechanism arranged to provide transfer movement of the substrate support relative to the precursor supply head.

The present invention further relates to a method for processing a surface of a substrate successively with a first precursor and a second precursor according to principles of atomic layer deposition. The method is carried out with an atomic layer deposition apparatus comprising a substrate support having a support surface. The support surface is provided with one or more substrate holders. The apparatus also comprises a precursor supply head having an output face. The output face is provided with at least one reaction zone comprising a precursor supply zone open to the output face of the precursor supply head. The support surface of the substrate support and the output face of the precursor supply head is arranged opposite to each other such that a reaction gap is provided between the support surface of the substrate support and the output face of the precursor supply head. The apparatus further comprises a moving mechanism. The substrate support and the precursor supply head are arranged to be rotated relative to each other with the moving mechanism such that the support surface of the substrate support and the output face of the precursor supply head are arranged to be rotated relative to each other. The apparatus further comprises a process chamber having chamber walls forming a chamber space inside the process chamber. The substrate support and the precursor supply head are arranged inside the process chamber.

The method comprises supporting the substrate in the substrate holder, supplying a precursor via the at least one reaction zone to the reaction gap, and rotating the substrate support and the precursor supply head relative to each other with the moving mechanism such that the reaction gap is maintained constant for subjecting the surface of the substrate to the precursor.

Preferably, substrate support is rotated.

According to the present invention, the at least one reaction zone of the precursor supply head further comprises a suction zone open to the output face of the precursor supply head. Further, the process chamber is provided with a discharge connection open to the chamber space.

According to the invention, the method further comprises discharging gases from the reaction gap by providing a suction underpressure to the reaction gap via the suction zone of the at least one reaction zone, and discharging gases from the chamber space of the process chamber outside the reaction gap by providing a discharge underpressure to the reaction space via the discharge connection, the discharge underpressure being greater than the suction underpressure.

In one embodiment, the atomic layer deposition apparatus comprises a first reaction zone provided with a first suction zone, and a second reaction zone provided with a second suction zone.

Further, the comprises supplying the first precursor via the first reaction zone to the reaction gap, discharging gases from the reaction gap by providing a first suction underpressure to the reaction gap via the first suction zone of the first reaction zone. The method also comprises supplying the second precursor via the second reaction zone to the reaction gap, and discharging gases from the reaction gap by providing a second suction underpressure to the reaction gap via the second suction zone of the second reaction zone. The method further comprises discharging gases from the chamber space of the process chamber outside the reaction gap by providing a discharge underpressure to the reaction space via the discharge connection, the discharge underpressure being greater than the first suction underpressure and the second suction underpressure.

In one embodiment, the substrate support comprises a back surface opposite the support surface, and the one or more substrate holders comprises a through hole extending through the substrate support between the back surface and the support surface. Accordingly, the method enables providing greater discharge force to the back side or back surface of the substrate than the suction force provided to the upper side or upper surface of the substrate. Thus, the substrate may be kept in place during processing even in high rotation speeds of the substrate support.

In preferred embodiments, the method is carried out with an atomic layer deposition apparatus as disclosed above.

The present invention provides efficient processing of the substrates such that the relative rotation speed between the substrate support and the precursor supply head may be arranged high without risk that the substrate may move or detach from the substrate support. The high rotation speed may be provided due to the suction zone provided to the output face of the precursor supply head in connection of the reaction zone as precursor is prevented from escaping the reaction zone. Further, the discharge connection and discharge underpressure keeps the substrate in place by directing the underpressure to the back side or back surface of the substrate via the through hole in the substrate support.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
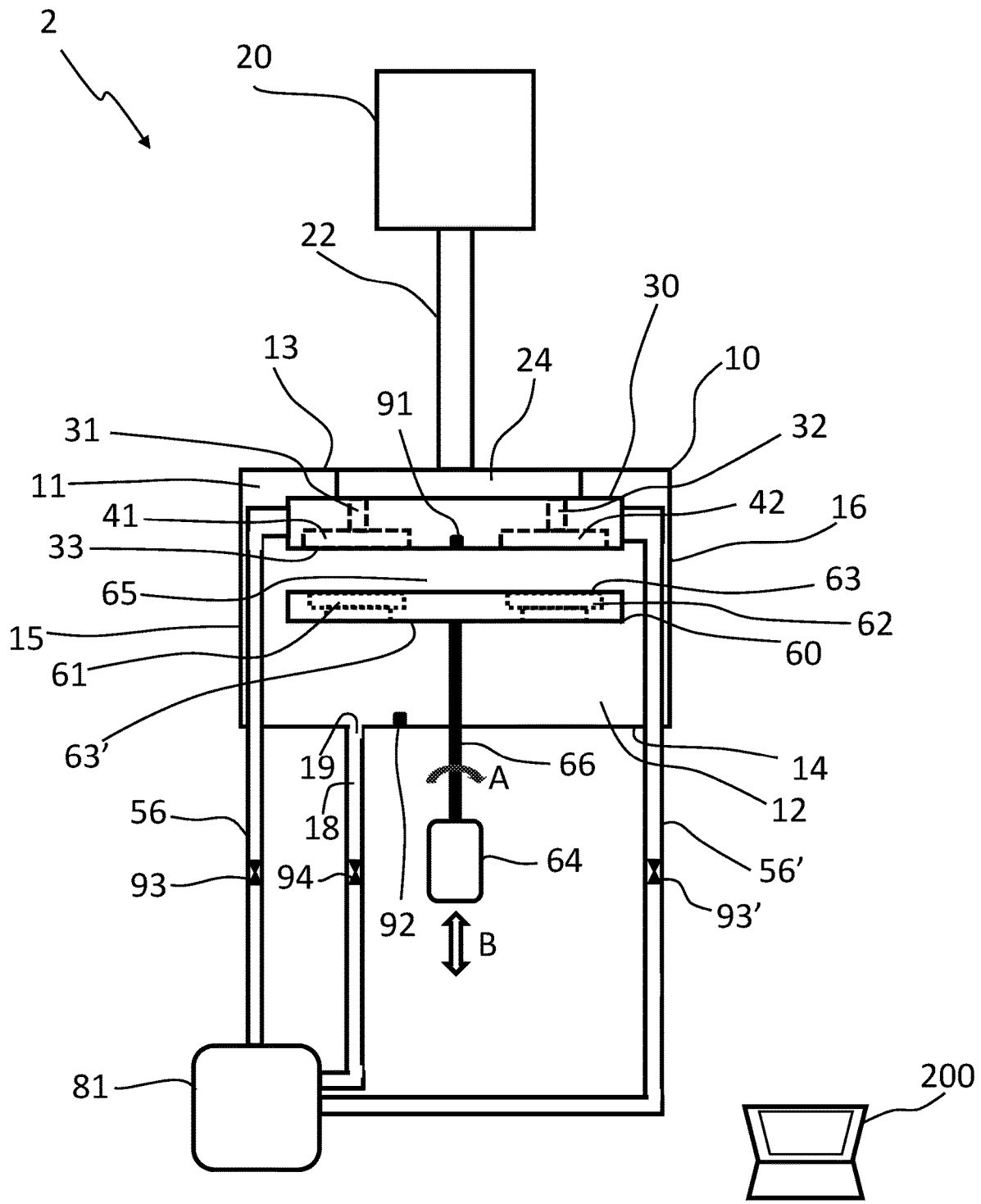
FIG. 1 shows a schematic view of an embodiment of an apparatus according to the present invention.

FIG. 1 shows an atomic layer deposition apparatus 2 for processing a surface of a substrate successively with at least a first precursor and a second precursor according to principles of atomic layer deposition. The apparatus comprises a process chamber 10 having a process chamber space 11 inside the process chamber 10. The process chamber 10 comprises process chamber walls 13, 14, 15, 16 defining the process chamber space 11.

The process chamber 10 is provided as a vacuum chamber and connected to a vacuum device or suction device 81. Thus, the process chamber 10 is provided as the process chamber and as the vacuum chamber 10. The suction device 81 may be vacuum pump, suction pump suction device or the like device arranged to provide vacuum or underpressure in the chamber space 11 of the process chamber 10.

The suction device 81 is arranged to provide vacuum or underpressure to the process chamber space 11 inside the process chamber 10. Further, the suction device 81 is arranged to discharge gases from the process chamber space 11 of the process chamber 10.

The suction device 81 is connected to the process chamber 10 with a discharge connection 18, 19 for providing suction or discharge force form the suction device 81 to the process chamber 10.

The discharge connection comprises a discharge opening 19 and a discharge conduit 18 extending between the suction device 81 and the discharge opening 19. The discharge connection 18, 19 and the discharge opening 19 are open to the process chamber space 11 of the process chamber 10.

The suction device 81 is arranged outside the process chamber 10. The discharge connection 18, 19 is provided to the chamber walls 13, 14, 15, 16 of the process chamber 10. The discharge opening 19 is provided to the chamber walls 13, 14, 15, 16 of the process chamber 10 and further the discharge opening 19 is open to the process chamber space 11 of the process chamber 10. The discharge conduit 18 extends from the discharge opening 19.

The discharge conduit 18 extends from the chamber wall or the bottom wall 14 to the suction device 81.

In the embodiment of FIG. 1, the discharge connection 18, 19 is provided to the bottom wall 14 of the process chamber 10. Further, the discharge opening 19 is provided to the bottom wall 14 of the process chamber 10.

In alternative embodiments, the discharge connection 18, 19 and the discharge opening 19 is arranged to other walls of the process chamber 10, such as the side walls 15, 16 or the top wall 13.

In an alternative embodiment, there is a separate vacuum chamber (not shown) surrounding the process chamber 10. Thus, the process chamber 10 is provided inside the vacuum chamber. The vacuum chamber is connected to the vacuum device for providing vacuum inside the vacuum chamber.

The substrates are processed inside the process chamber 10.

The apparatus 2 further comprises a substrate support 60 having a support surface 63 and arranged to support one or more substrates on the support surface 63. The substrate support 60 is arranged to support and hold one or more substrates during processing the substrates with the apparatus 2.

The substrate support 60 is provided inside the process chamber 10. Thus, the substrate support 60 is inside the process chamber space 11.

The support surface 63 is planar surface extending on a plane.

The substrates are ranged on the or in connection with the support surface 63. Preferably, the substrates are planar or plate-like substrates having two main substrate surfaces, such as silicon wafers.

The substrates are usually supported to the substrate support 60 such that the substrate surface or main substrate surface is parallel to the support surface 63.

The substrate support 60 comprises one or more substrate holders 61, 62 arranged to secure and hold one or more substrates during processing. The substrate holders 61, 62 are provided to the support surface 63 or in connection with the support surface 63.

One substrate holder 61, 62 is arranged to hold one substrate.

The substrates are supported to the support surface 63 such that the upper surface facing away from the support surface 63 is flush with or at the level of the support surface 63.

In some alternative, embodiments the substrates are supported to the support surface 63 such that the upper surface facing away from the support surface 63 is below the support surface 63.

Further, in some embodiments, substrates are supported to the support surface 63 such that the upper surface facing away from the support surface 63 is above the support surface 63. In these embodiments, the substrates may be support directly on the support surface 63.

The substrate support 60 further comprises back surface 63' on opposite side of the substrate support 60 in relation to the support surface 63.

The substrate holders 61, 62 for holding the substrates are provided with through hole extending through the substrate support 60 from the support surface 63 to the back surface 63'.

The apparatus of the present invention further comprises a precursor supply head 30 having an output face 33. The output face 33 is provided with at least one gas distribution element 41, 42 via which precursors are supplied. The one or more gas distribution elements 41, 42 provide one or more reaction zones 44, 44', respectively, or form one or more reaction zones 44, 44', as shown later in connection with FIG. 10.

The precursor supply head 30 is provided inside the process chamber 10. Thus, the precursor supply head 30 is inside the process chamber space 11.

As shown in FIG. 1, the support surface 63 of the substrate support 60 and the output face 33 of the precursor supply head 30 are arranged opposite to each other. The support surface 63 and the output face 33 are spaced apart from each other such that a reaction gap 65 is provided between the support surface 63 and the output face 33.

Precursors are supplied via the output face 33 towards the support surface 63 and the substrates are arranged to the support surface 63 during processing. Further, precursors are supplied from the one or more gas distribution elements 41, 42, or one or more reaction zones 44, 44' towards the support surface 63 via the reaction gap 65. Therefore, during processing the precursors, as well as possible purge gas, travel in the reaction gap 65 towards or against the support surface 63 and the substrates supported to the support surface 63.

The output face 33 of the precursor supply head 30 and the support surface 63 of the substrate support 60 are arranged parallel to each other. The parallel output face 33 and the support surface 63 together form a uniform reaction gap 65. The uniform reaction gap 65 means that the distance between the output face 33 and the support surface 33 is constant in the area between the output face 33 and the support surface 63.

In the embodiment of the FIG. 1, the substrate support 60 is arranged in vertical direction below precursor supply head 30. Further, the support surface 63 is arranged in vertical direction below the output face 33. Accordingly, the precursors and possible purge gas are supplied from the precursor supply head 30 via the output face 33 downwards and towards the support surface 63.

The gas distribution elements 41, 42 and the reaction zones 44, 44' are provided to the output face 33 or in connection with the output face 33 such that precursors are supplied via the output face 33.

The precursor supply head 30 is connected to a precursor supply system 20. The precursor supply system 20 comprises precursor sources (not shown), such as precursor containers or the like, and one or more pumps and valves (not shown) for supplying precursors to the precursor supply head 30 via a supply conduits 22, 24.

The precursor supply system 20 may also comprise purge gas sources (not shown), such as purge gas containers or the like, and one or more pumps and valves (not shown) for supplying purge gas to the precursor supply head 30 via the supply conduits 22, 24.

The supply conduits 22, 24 comprise one or more precursor conduits, one for each precursor. The precursor conduits are connected to the precursor sources in the precursor supply system 20.

Further, the gas distribution elements 41, 42, or the reaction zones 44, 44' thereof, comprise precursor supply zones or precursor supply nozzles for supplying precursors via the precursor supply head 30.

The supply conduits 22, 24 further comprise one or more purge gas conduits. The purge gas conduits are connected to the purge gas sources in the precursor supply system 20.

Further, the gas distribution elements 41, 42, or the reaction zones 44, 44' thereof, comprise purge gas zones or purge gas nozzles for supplying purge gas via the precursor supply head 30.

As shown in FIG. 1, the precursor supply system 20 is arranged outside of the process chamber 10. The supply conduits 22, 24 extends between the precursor supply system 20 and the precursor supply head 30. Accordingly, the supply conduits 22, 24 extend from outside the process chamber 10 through the chamber walls into the process chamber 10 and further to the precursor supply head 30.

At least one of the reaction zones 44, 44' may comprise a plasma discharge arrangement arrange to provide plasma discharge during the precursor supply.

In embodiments comprising the separate vacuum chamber surrounding the process chamber 10, the precursor supply system 20 is arranged outside of the vacuum chamber. Accordingly, the supply conduits 22, 24 extend from outside the vacuum chamber through the vacuum chamber walls into the vacuum chamber and further through the process chamber walls into the process chamber 10 and to the precursor supply head 30.

The precursor supply head 30 comprises supply channels 31, 32 for the precursors, purge and suction.

The supply channels 31, 32 are connected to the corresponding supply conduits 22, 24. Further, the supply channels 31, 32 of the precursor supply head 30 are connected to the one or more gas distribution elements 41, 42, or one or more reaction zones 44, 44', respectively, of the precursor supply head 30.

The supply channels 31, 32 may comprise one or more precursor supply channels, for supplying precursors. The precursor supply channels are connected to the one or more gas distribution elements 41, 42, or one or more reaction zones 44, 44', respectively. Each precursor may be provided with a separate precursor supply channel. The precursor supply channels are connected between the one or more gas distribution elements 41, 42, or one or more reaction zones 44, 44', respectively, and the precursor supply conduits of the supply conduit 22.

The supply channels 31, 32 may comprise one or more purge gas supply channels, for supplying purge gas. The purge gas supply channel(s) are connected to the one or more gas distribution elements 41, 42, or one or more reaction zones 44, 44', respectively. The purge gas supply channels are connected between the one or more gas distribution elements 41, 42, or one or more reaction zones 44, 44', respectively, and the purge gas supply conduits of the supply conduit 22.

According to the above mentioned, gas exchange between the precursor supply system 20 and the one or more gas distribution elements 41, 42, or one or more reaction zones 44, 44', is carried out via the supply conduits 22, 24 and the supply channels 31, 32.

The apparatus further comprises one or more suction connections 56, 56' connected to the precursor supply head 30 and to the gas distribution elements 41, 42, or reaction zones 44, 44', thereof.

Further, the gas distribution elements 41, 42, or the reaction zones 44, 44' thereof, comprise suction zones or suction nozzles for discharging gases via the precursor supply head 30.

The suction connections 56, 56' are connected to the suction device 81 for providing a suction force via the gas distribution elements 41, 42, or the reaction zones 44, 44' thereof. The suction device 81 provides suction or suction force via the suction zones of the precursor supply head 30 and the gas distribution elements 41, 42 thereof to the reaction gap 65.

In the embodiment of FIG. 1, the suction device 81 is common suction device connected to suction connections 56, 56', and the suction zones, and to the discharge connection for providing suction to the reaction gap 65 and to the chamber space 11 outside the reaction gap 65.

The suction zones or suction nozzles are open to the output face 33 of the precursor supply head 30.

The suction connections 56, 56' comprise suction conduits 56, 56' extending from the precursor supply head 30, and the gas distribution elements 41, 42, or the reaction zones 44, 44' thereof. The suction conduits 56, 56' are further connected to the suction device 81.

The suction conduits 56, 56' extend from the precursor supply head 30 and out of the process chamber 10. As shown in FIG. 1, the suction device 81 is arranged outside the process chamber 10. The suction conduits 56, 56' extend between the suction device 81 and the precursor supply head 30. Accordingly, the suction conduits 56, 56' extend from outside the process chamber 10 through the chamber walls into the process chamber 10 and further to the precursor supply head 30.

In the embodiment of FIG. 1, each gas distribution element 41, 42, or reaction zone 44, 44' thereof, comprises a separate suction connection 56, 56' or suction conduit 56, 56', respectively.

The suction conduits 56, 56' are arranged to extend into the process chamber space 11 through the bottom wall 14 of the process chamber 10 in the embodiment of FIG. 1. Accordingly, the suction device 81 is arranged outside the process chamber 10 and the suction conduits 56, 56' extend from the precursor supply head 30 through the bottom wall 14 of the process chamber 10 to the suction device 81.

In alternative embodiment, the suction conduits 56, 56' are provided to other walls of the process chamber 10, such as the side walls 15, 16 or the top wall 13.

In an alternative embodiment, the suction conduit(s) 56, 56' are provided in connection with the supply conduit(s) 20 of the precursor supply system 20. Thus, no additional lead-thoughts to the process chamber 10 are needed.

Preferably, the discharge connection 18, 19 and the suction connection 56, 56', or suction conduits 56, 56', are provided to the bottom wall 14 of the process chamber 10 and the precursor supply conduits 22, 24, precursor supply connections 22, 24, are provided to the top wall 13 or in connection with the top wall 13 of the process chamber 10.

As shown in FIG. 1, the substrate support 60 is arranged in vertical direction below the precursor supply head 30 in the process chamber 10, and the discharge connection 18, 19 is provided below the support surface 63 of the substrate support 60 inside the process chamber 10. Further, the discharge connection 18, 19 is provided below the substrate support 60 in the process chamber 10.

The discharge connection is arranged below the substrate support in the processing position of the substrate support.

Further, the discharge connection 18, 19 is open to the chamber space 11 outside the reaction gap 65. The suction connections 56, 56' are open to the reaction gap 65.

In the embodiment of FIG. 1, the apparatus 2 comprises a substrate processing unit 30, 60, 65 comprising the substrate support 60, the precursor supply head 30 and the reaction gap 65 between the support surface 63 of the substrate support 60 and the output face 33 of the precursor supply head 30. The process chamber 10 comprises an intermediate chamber space 12 surrounding the substrate processing unit 30, 60, 65 inside the chamber space 11 of the process chamber 10. The discharge connection 18, 19 is open to the intermediate chamber space 12.

The suction connections 56, 56' are open into the processing unit 30, 60, 65, or to the reaction gap 65 inside the processing unit 30, 60, 65. Thus, the suction connections 56, 56' subject the suction force into the reaction gap 65 inside the processing unit 30, 60, 65.

Preferably, the discharge connection 18, 19 is open to the intermediate chamber space 12 in vertical direction below the substrate processing unit 30, 60, 65. Thus, the discharge connection 18, 19 subjects the suction force to the intermediate space 12 surrounding the processing unit 30, 60, 65. Further, the discharge connection 18, 19 subjects the suction force outside the reaction gap 65.

The discharge connection 18, 19 is arranged below the substrate support 60 in the processing position of the substrate support 60.

In the embodiment of FIG. 1, the precursor supply head 30 comprises a first gas distribution element 41 and a first reaction zone 44. A first suction zone is provided to the first gas distribution element 41 and the first reaction zone 44. Further, a first suction conduit 56 is arranged to extend form the first suction zone, or the first gas distribution element 41 and the first reaction zone 44 to the suction device 81. The suction device 81 is arranged outside the process chamber 10 and the first suction conduit 56 extends from the precursor supply head 30 and the from the first gas distribution element 41 through the bottom wall 14 of the process chamber 10 to the suction devices 81.

Further, precursor supply head 30 comprises a second gas distribution element 42 and a second reaction zone 44'. A second suction zone is provided to the second gas distribution element 42 and the second reaction zone 44'. Further, a second suction conduit 56' is arranged to extend form the second suction zone, or the second gas distribution element 42 and the second reaction zone 44' to the suction device 81. The suction device 81 is arranged outside the process chamber 10 and the second suction conduit 56' extends from the precursor supply head 30 and the from the second gas distribution element 42 through the bottom wall 14 of the process chamber 10 to the suction devices 81.

In the embodiment of FIG. 1, there are a first suction connection 56, a second suction connection 56' and the discharge connection 18, 19. Thus, there are three separate connections via which gases are removed from the process chamber 10. The first suction connection 56, the second suction connection 56' and the discharge connection 18, 19 are connected to the common suction device 81.

The suction force provided by the first suction zone and the second suction zone of the first and second reaction zones 44, 44' is subjected to the substrates supported to the support surface 63 of the substrate support 60 in the reaction gap 65. Accordingly, the suction force provided by the first suction zone and the second suction zone of the first and second reaction zones 44, 44' is directed into the reaction gap 65 and from the output face 33 towards the support surface 63.

Thus, these suctions forces tend to draw the substrates or detach the substrates from the support surface 63 towards the output face 33 of the precursor supply head 30 in the reaction gap 65. The suction forces are directed to upper surface of the substrates facing the output face 33 of the precursor supply head 30.

However, the discharge force provided by the discharge connection 18, 19 and the suction device 81 provides a counter force to the substrates supported on the support surface 63 of the substrate support 60 via the through holes of the substrate holders 61, 62. The through holes extend between the back surface 63' and support surface 63 of the substrate support 60. Accordingly, the discharge force provided by the suction device 81 via the discharge connection 18, 19 is directed to the lower surface of the substrates via the through holes. Thus, the discharge force tends to draw the substrates against the support surface 63 via the through holes for keeping the substrates in place on the support surface 63.

The discharge connection 18, 19 and the discharge opening 19 are provided to the bottom wall 14 of the process chamber 10. Further, in the embodiment of the FIG. 1 the discharge connection 18, 19 and the discharge opening 19 are arranged below the substrate support 60 for emphasizing the discharge force to the lower surface of the substrate via the through holes.

The discharge connection 18, 19 or the discharge opening 19 is arranged below the substrate support 60 in the processing position of the substrate support 60.

The first suction connection or the first suction conduit 56 is provided with a first suction control valve 93 for adjusting or controlling suction via the first suction zone or the first reaction zone 44. The suction via the first reaction zone 44 and the first suction connection 56 is generated by the suction device 81. Similarly, the second suction connection or the second suction conduit 56' is provided with a second suction control valve 93' for adjusting or controlling suction via the second suction zone or the second reaction zone 44'. The suction via the second reaction zone 44' and the second suction connection 56' is generated by the suction device 81. Further, the discharge connection 18, 19 is provided a discharge control valve 94 for adjusting or controlling discharge via the discharge connection 18, 19. The discharge via the discharge connection 18, 19 is generated by the suction device 81.

As shown in FIG. 1, there is a suction pressure sensor 91 arranged in connection with the reaction gap 65. The suction pressure sensor 91 is provided to the nozzle head 30 and arranged to measure pressure in the reaction gap 65.

Alternatively, the suction pressure sensor may be arranged to the substrate support 60 and arranged to measure pressure in the reaction gap 65.

The apparatus further comprises a discharge pressure sensor 92 arranged in connection with the chamber space 11, or the intermediate chamber space 12, outside the reaction gap 65. The discharge pressure sensor 92 is arranged to measure pressure in the chamber space 11, or the intermediate chamber space 12, outside the reaction gap 65.

The apparatus 2 may further comprises control unit 200. The control unit may be computer or the like control unit. The control unit 200 may comprise at least one processor and a memory.

The control unit 200 is configured to control operation of the apparatus 2. The control unit 200 is arranged to control the precursor supply and operation of the precursor supply system 20. Further, the control unit 200 is arranged to control operation of the suction devices 81.

The control device 200 may be arranged to control or adjust the first and second suction control valves 93, 93' and the discharge control valve 94 such that suction via each of the first and second suction connection 56, 56' and the discharge connection 18 may be adjusted.

The suction pressure sensor 91 and the discharge pressure sensor 92 are connected to the control unit 200 for providing measurement data to the control unit 200.

Accordingly, the control unit 200 is arranged to adjust the first and second suction control valves 93, 93' and the discharge control valve 94 based on predetermined control criteria for providing desired suction forces via the first and second suction zones of the first and second reaction zones 44, 44', respectively, and via the discharge connection 18, 19.

The first and second suction control valves 93, 93' and the discharge control valve 94 are adjusted with the control unit 200 such that the discharge underpressure in the process chamber space 11 of the process chamber 10 is greater than the suction underpressure in the reaction gap 65. Accordingly, this means that pressure in the process chamber space 11 of the process chamber 10 is lower than the pressure in the reaction gap 65.

Further, this means that the discharge force via the discharge connection 18, 19 is greater than the suction forces via the gas distribution elements 41, 42, or the reaction zones 44, 44' thereof.

In some embodiments, the discharge force via the discharge connection 18, 19 is greater than the sum of the suction forces via the first and second gas distribution elements 41, 42, or the reaction zones 44, 44' thereof, form the first and second suction connections 56, 56'.

According to the present invention, the precursor supply head 30 and the substrate support 60 are rotated in relation to each other around a rotation axis 66.

In the embodiment of FIG. 1, the substrate support 60 is rotated around the rotation axis 66.

The rotation axis 66 extends perpendicularly to the output face 33 and the support surface 63. Therefore, the reaction gap 65 is maintained constant during the rotation.

Figure 2:
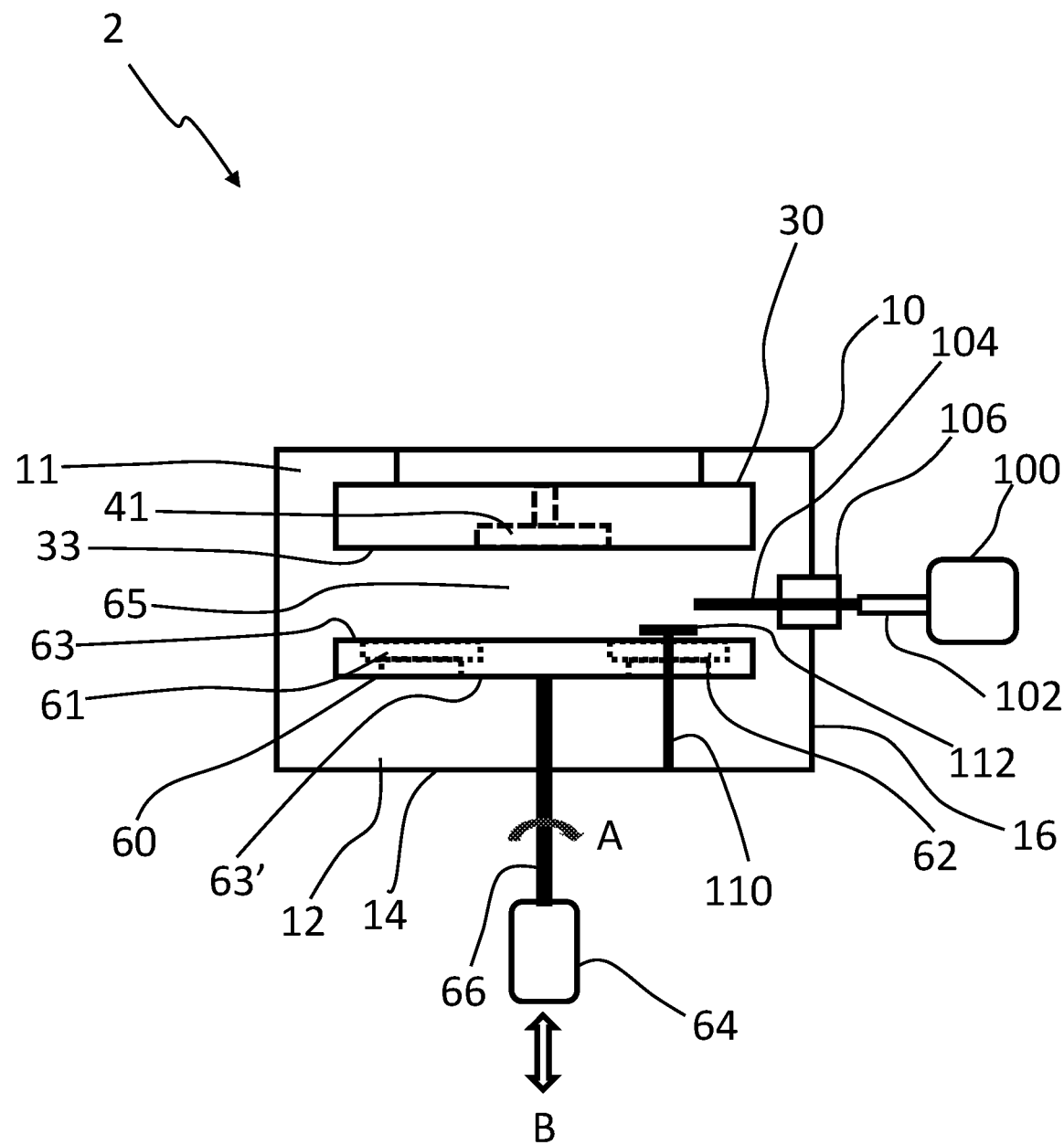
FIGS. 2 and 3 show schematically loading of a substrate to an apparatus according to the present invention.
Figure 3:
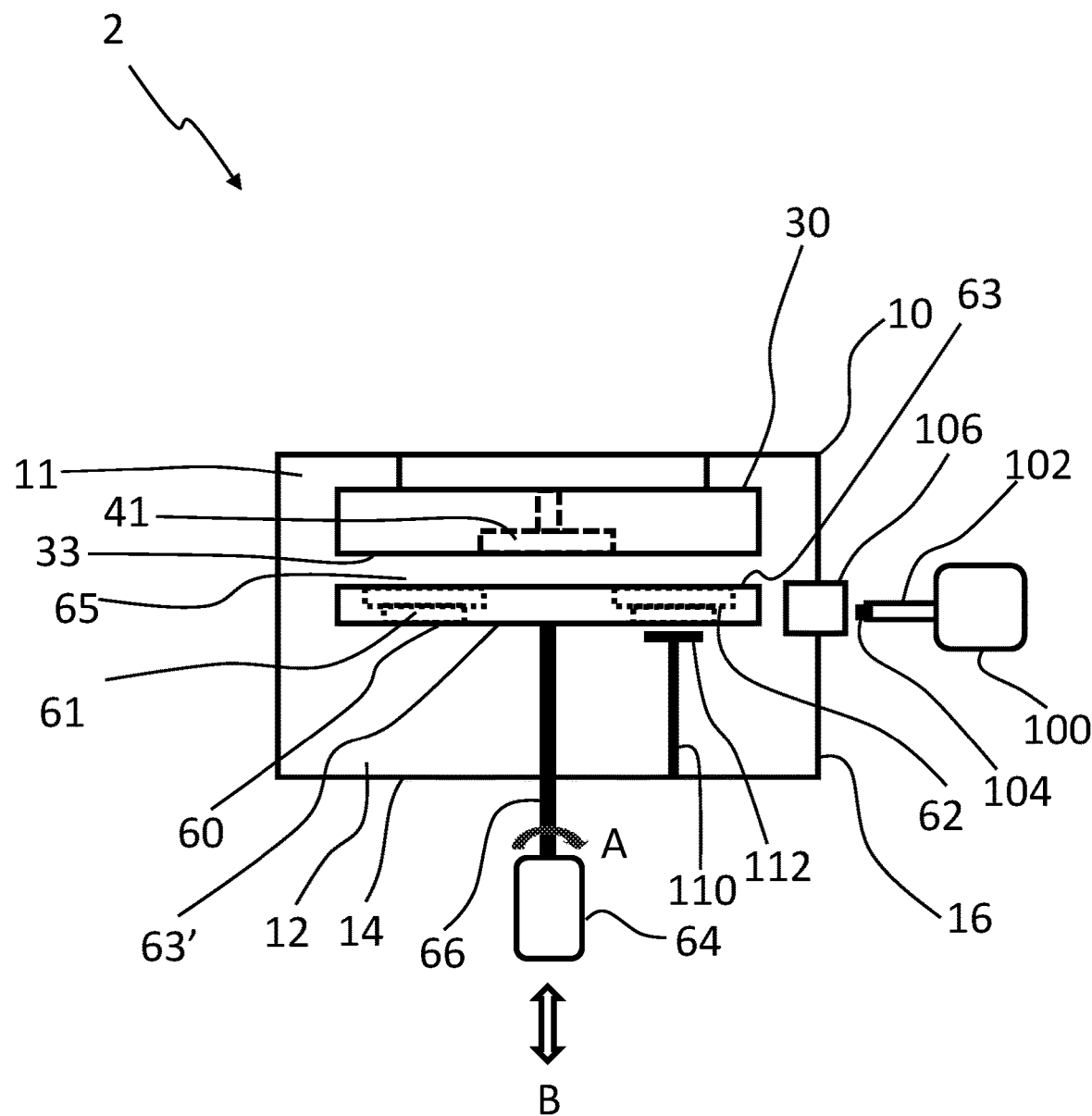

In the embodiment of FIGS. 1 to 3, the rotation axis 66 is connected to the substrate support 60 and arranged to rotate the substrate support 60.

In the embodiments of FIGS. 4 to 7, the rotation axis 66 is also preferably connected to the substrate support 60 and arranged to rotate the substrate support 60, but the rotation axis 66 and a rotating mechanism are omitted.

Alternatively, the rotation axis 66 is connected to the precursor supply head 30 and arranged to rotate the precursor supply head 30.

During the rotation, the substrates supported to the support surface travel in rotational motion in relation to the one or more gas distribution elements 41, 42, or one or more reaction zones 44, 44', respectively, of the precursor supply head 30. Thus, the substrates are successively subjected to the precursors supplied via the one or more gas distribution elements 41, 42, or one or more reaction zones 44, 44', respectively, of the precursor supply head 30 due to the relative rotational movement. During the rotation, the substrates travel past the one or more gas distribution elements 41, 42, or one or more reaction zones 44, 44', respectively, of the precursor supply head 30 and are thus subjected to the precursors.

The apparatus 2 comprises a rotating mechanism 64, 66. The substrate support 60 and the precursor supply head 30 are arranged to be rotated relative to each other with the rotating mechanism 64, 66. The substrate support 60 and the precursor supply head 30 are arranged to be rotated relative to each other with the rotating mechanism such that the support surface 63 of the substrate support 60 and the output face 33 of the precursor supply head 30 are arranged to be rotated relative to each other.

In the embodiment of FIG. 1, the rotating mechanism 64, 66 or the rotating device 64 is connected to the substrate support 60 for rotating the substrate support 60. The rotating device 64 comprises a rotating motor or the like device arranged to output rotating movement.

The rotating device 64 is connected to the substrate support 60 with the rotation axis 66 arranged to transfer rotating movement from the rotating device 60 to the substrate support 60. The rotating device 64 and the rotation axis 66 are arranged to rotate the substrate support 60 in rotation direction A.

The rotation axis 66 extends perpendicularly to the support surface 63.

Accordingly, the rotation axis 66 extends in vertical direction.

As shown in FIG. 1, the rotating device 64 is arranged outside the process chamber 10. The rotation axis 66 extends between the rotating device 64 and the substrate support 60. Accordingly, the rotation axis 66 extends from outside the process chamber 10 through the chamber walls into the process chamber 10 and further to the substrate support 60.

The rotating device 64 is arranged in vertical direction below the substrate support 60. As shown in FIG. 1, the rotation axis 66 extends from outside the process chamber 10 through the bottom wall 14 of the process chamber 10 into the process chamber space 11 and to the substrate support 60.

In embodiments comprising the separate vacuum chamber surrounding the process chamber 10, the rotating device 64 is arranged outside of the vacuum chamber. Accordingly, the rotation axis 66 extends from outside the vacuum chamber through the vacuum chamber walls into the vacuum chamber and further through the process chamber walls into the process chamber 10 and to the substrate support 60.

The rotating mechanism 64, 66 is further provided with a lifting device or lifting mechanism. In embodiment of FIGS. 1 to 3, the lifting device or mechanism is provided in connection with or as integral part or feature of the rotating mechanism 64.

In an alternative embodiment, the lifting device or lifting mechanism connected to the rotation axis 66.

The lifting mechanism or lifting device is arranged to move or adjust the position of the substrate support 60 in vertical direction in relation to the precursor supply head 30. Accordingly, the lifting mechanism or lifting device is arranged move or adjust the position of the substrate support 60 in the direction of the rotation axis 66 as shown with arrow B in FIG. 1.

Therefore, the lifting mechanism or lifting device enables adjusting the distance between the output face 33 of the precursor supply head 30 and the support surface 63 of the substrate support 60. Thus, the height of the reaction gap 65 may be adjusted.

Accordingly, the apparatus 2 comprises a moving mechanism connected to the substrate support 60 and arranged to rotate the substrate support 60 and to move or lift the substrate support 60 towards and away from the precursor supply head 30.

Therefore, the moving mechanism is arranged to move the substrate support 60 and the precursor supply head 30 relative to each other in direction transverse to the support surface 63 of the substrate support 60 such that the reaction gap 63 between the support surface 60 and the output surface 33 is adjusted.

The moving mechanism comprises the rotating device 60 and the lifting device.

This enables utilizing different height in the reaction gap for different coating processes. Further, this enables moving the substrate support 60 in to a loading position in which the substrates may be loaded and unloaded from the substrate support 60 and the support surface 63 is far from the output face 33. Further this enables moving the substrate support 60 in to a process position in which the reaction gap 65 is formed between the support surface 63 and the output face 33.

FIGS. 2 and 3 shows schematically loading of a substrate 104 into the process chamber 10. The apparatus 2 comprises at least one lifting pin 110, 112 provided inside the process chamber 10, as shown in FIG. 2. The lifting pin 110, 112 is a fixed lifting pin extending in vertical direction inside the process chamber 10.

The lifting pin 110, 112 comprises a lifting pin rod 110 extending in vertical direction and in the direction of the rotation axis 66.

In the embodiment of FIGS. 2 and 3, the lifting pin rod 110 is connected to the bottom wall 14 of the process chamber 10 and arranged to extend upwards from the bottom wall 14 in vertical direction.

The lifting pin 110, 112 further comprises a lifting pin end 112 provided to the upper end of the lifting pin rod 110. The lifting pin end 112 comprises a pin surface against which a substrate may be supported.

It should be noted that in alternative embodiment there may be more than one lifting pins, for example there lifting pins with three lifting pin rods.

Further, in the embodiment of FIGS. 2 and 3 the lifting pin end 112 is provided as plate. In an alternative embodiment, the lifting pin end 112 may be provided with three or more branch pins to which the substrate is supported.

The process chamber 10 is further provided with loading lead-through connection 106 arranged to the process chamber wall. The loading lead-through connection 106 is arranged to enabled loading and unloading of substrates into and from the process chamber 10 without breaking the vacuum conditions of the process chamber 10 or without need to open the process chamber 10.

In some embodiments, the loading lead-through connection 106 is provided as a gate valve or the like valve arrangement arranged to enabled loading and unloading of substrates into and from the process chamber 10 without breaking the vacuum conditions of the process chamber 10.

In the embodiment of FIGS. 2 and 3, the loading lead-through connection 106 is provided to a side wall 16 of the process chamber 10 for loading and unloading of substrates via the side wall 16 into and from the process chamber 10.

The apparatus 2 may further comprise a loading device 100 arranged to load and unload substrates into and from the process chamber 10. The loading device 100 may be a loading robot or the like automated device. The loading device 100 may be operated with the control unit 200.

The loading device 100 comprises a loading arm 102 having an end effector 104. The end effector 104 is a movable or extendable arm or robot arm which is arranged to be transferred into the process chamber 10 and out of the process chamber 10 via the loading lead-through connection 106. The substrate to be loaded is placed on the end effector 104 or is arranged to the end effector 104 and the loading device 100 is arranged to transport the substrate from outside the process chamber 10 to the substrate holder 61, 62 of the substrate support 60 via the loading lead-through connection 106. Similarly, the substrate to be unloaded is placed on the end effector 104 or is arranged to the end effector 104 and the loading device 100 is arranged to transport the substrate from inside the process chamber 10 and from the substrate holder 61, 62 of the substrate support 60 via the loading lead-through connection 106 outside the process chamber 10.

FIG. 2 shows the apparatus 2 and the substrate support 60 in loading position. In the loading position the substrate support 60 is moved or lowered downwards away from the precursor supply head 30 with a moving mechanism. The moving mechanism comprises the rotating device, lifting device and the rotation axis 66. The substrate support 60 is arranged and rotated with the rotating device 64 or the moving mechanism to position in which the substrate holder 62 is aligned with the lifting pin 110, 112. Then, the substrate support 60 is lowered downwards with the lifting device or the moving mechanism away from the precursor supply head 30 such that the lifting pin 110, 112 protrudes through the through hole of the substrate holder 62. Thus, in the loading position the lifting pin 110, 112 protrudes through the through hole of the substrate holder 62.

In the loading position the loading device 100 is arranged to transport a substrate with the end effector 104 via the loading lead-through connection 106 into the process chamber 10 and place the substrate on the lifting pin 110, 112 and the lifting pin end 112 or the upper pin surface thereof, as shown in FIG. 2. The upper pin surface of the lifting pin end 112 is towards the precursor supply head 30. Then, the end effector 104 is removed or retracted form the process chamber 10 via the loading lead-through connection 106.

Then, when the substrate is placed on the lifting pin end 112 and the end effector 104 is removed or retracted form the process chamber 10, the substrate support 60 is moved or raised upwards with the lifting device or the moving mechanism towards the precursor supply head 30 to a process position in which the support surface 63 of the substrate support 60 is close to the output face 33 of the precursor supply head 30 such that the reaction gap 65 is formed, as shown in FIG. 3. When the substrate support 60 is raised, the lifting pin 110, 112 leaves the substrate holder 62 and the through hole thereof and at the same time the substrate is set down on the support surface 63 and the substrate holder 62 for supporting the substrate during processing.

Alternatively, the substrate support 60 is raised such that the lifting pin 110, 112 or the pin surface of the lifting pin end 112 is below the support surface 63 of the substrate support 60 or below a substrate support surface of the substrate holder 62.

Then the substrate may be processed in the process chamber 10.

When substrates are unloaded from the process chamber 10, the substrate support 60 is first lowered and moved downwards with the lifting device or the lifting mechanism such that the lifting pin 110, 112 extends through the substrate holder 62 and the through hole thereof. As the lifting pin 110, 112 extends through the substrate holder 62 and the through hole thereof, the substrate is placed on the lifting pin end 112 from the substrate holder 62, as shown in FIG. 2. Then the end effector 104 of the loading device 100 is transferred into the process chamber 10 via the loading lead-through connection 106 and the substrate is removed from the lifting pin end 112 with the end effector 104. Them the end effector 104 moved or retracted from the process chamber together with the substrate.

According to the above mentioned, the through holes of the substrate holders 61, 62 are provided for loading and unloading the substrates efficiently to and from the process chamber 10. Thus, the loading and unloading may be carried out with two linear movements of the substrate support 60 and the loading device 100, respectively.

Figure 4:
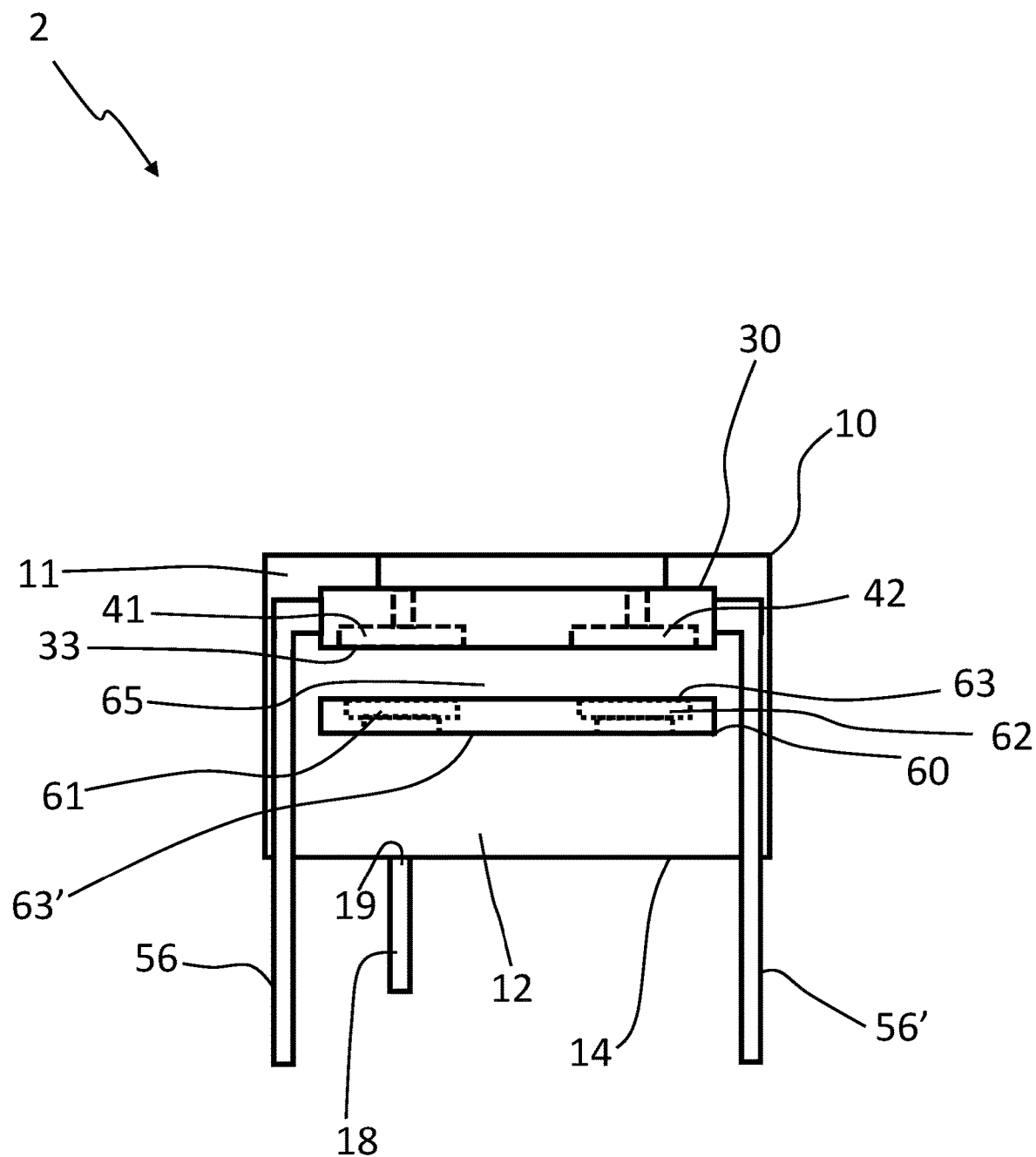
FIGS. 4, 5, 6 and 7 show different embodiments of the apparatus according to the present invention.

FIG. 4 shows one embodiment of the apparatus in which the moving mechanism and loading device 100 and the suction device 81 are omitted.

In the embodiment of FIG. 4, the discharge connection 18, 19 is open to the process chamber space 11 and the intermediate space 12 below the substrate processing unit 30, 60, 65. Further, the discharge opening 19 is provided to the process chamber walls below the substrate processing unit 30, 60, 65.

The discharge connection 18, 19 is arranged below the substrate processing unit 30, 60, 65 in the processing position of the substrate support 60.

Further, the discharge connection 18, 19 is open to the process chamber space 11 and the intermediate space 12, and in vertical direction below the substrate support 600 in the process chamber space 11. Further, the discharge opening 19 is provided to the process chamber walls in vertical direction below the substrate support 60 in the process chamber space 11.

The discharge opening 19 is arranged below the substrate support 60 in the processing position of the substrate support 60.

As shown in FIG. 4, the discharge connection 18, 19 is provided to the bottom wall 14 of the process chamber 10. Further, the discharge opening 19 is provided to the bottom wall 14 of the process chamber 10.

Accordingly, the discharge connection 18, 19 and discharge opening 19 provided below the processing unit 30, 60, 65 or the substrate support 60 enables subjecting the discharge suction force to the back surface 63' and to the lower surface of the substrates via the substrate holders 61, 62 and through holes thereof.

In the embodiment of FIG. 4, the suction connections 56, 56' or the suction conduits 56, 56' are arranged to extend from the bottom wall 14 of the process chamber 10 to the precursor supply head 30. Thus, the suction connections 56, 56' or the suction conduits 56, 56' extend inside the process chamber space 11 from the precursor supply head 30 to the bottom wall 14.

In an alternative embodiment, the suction connections 56, 56' or the suction conduits 56, 56' are arranged to extend from side walls 15, 16 of the process chamber 10 to the precursor supply head 30. Thus, the suction connections 56, 56' or the suction conduits 56, 56' extend inside the process chamber space 11 from the precursor supply head 30 to the side walls 15, 16.

Figure 5:
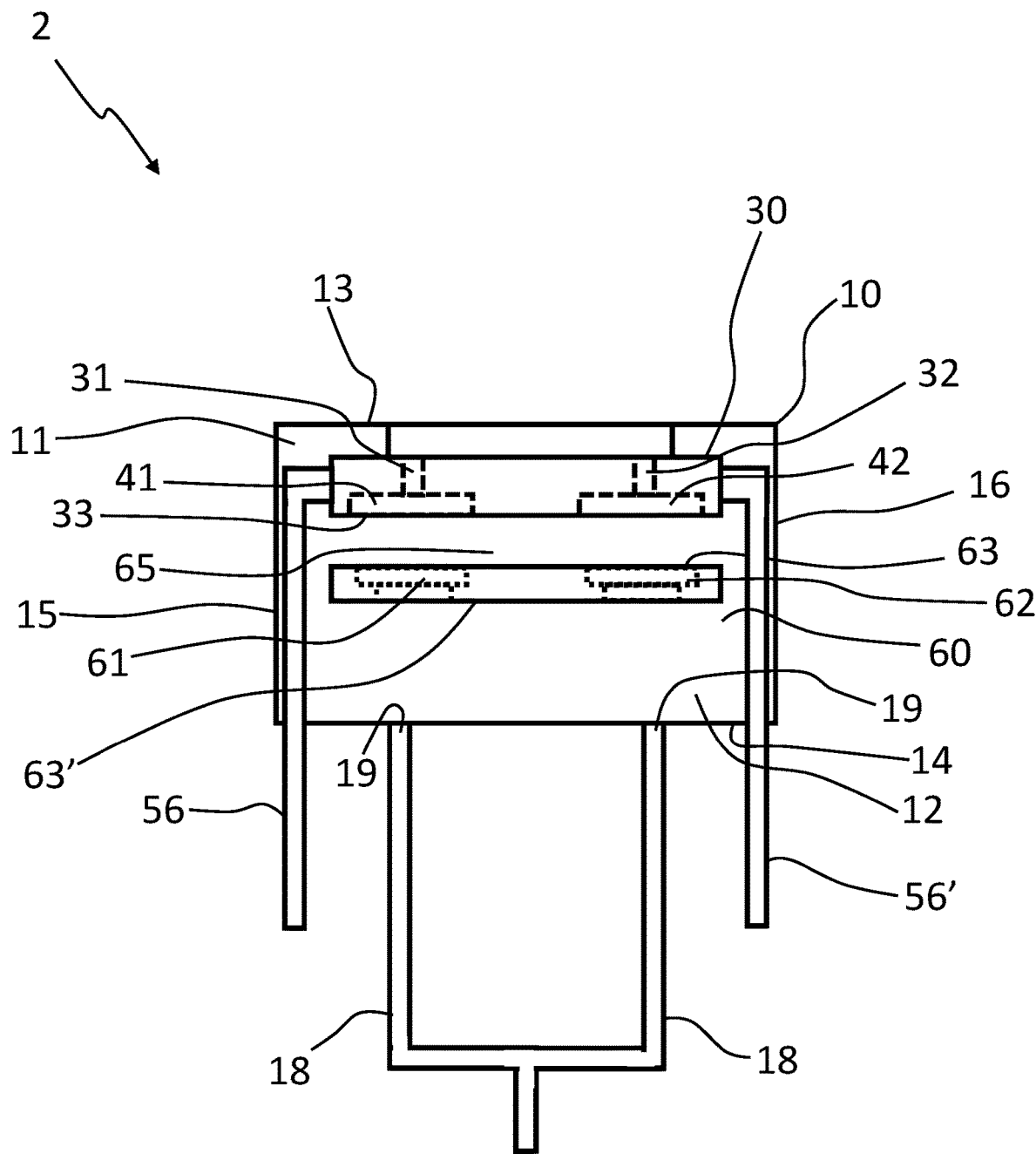

FIG. 5 shows an alternative embodiment, in which there is two discharge conduits 18. Each of the discharge conduits 18 comprise the discharge opening 19 open to the chamber space 11.

As shown in FIG. 5, the discharge conduits 18 are connected to each other and further to the suction device 81. Thus, same suction or underpressure is provided to the chamber space 11 via both discharge conduits 18 and discharge openings 19.

In an alternative embodiment, the discharge conduits 18 may be separate connected to the suction device 81. Further, in a yet alternative embodiment, the two separate discharge conduits 18 are connected to separate suction devices 81.

The discharge connection 18, 19 and the discharge openings 19 are open to the process chamber space 11 of the process chamber 10.

In a further alternative embodiment, there may be more than two discharge connections 18, 19, discharge conduits 18, discharge opening and/or suction devices 81 in connection with the process chamber 10.

Two or more discharge connections 18, 19 enable distribute the discharge underpressure more evenly to the process chamber.

In the embodiment of FIG. 5, the discharge connections 18, 19 are open to the process chamber space 11 and the intermediate space 12 below the substrate processing unit 30, 60, 65. Further, the discharge openings 19 are provided to the process chamber walls below the substrate processing unit 30, 60, 65

Further, the discharge connections 18, 19 are open to the process chamber space 11 and the intermediate space 12, and in vertical direction below the substrate support 60 in the process chamber space 11. Further, the discharge openings 19 are provided to the process chamber walls in vertical direction below the substrate support 60 in the process chamber space 11.

As shown in FIG. 5, the discharge connections 18, 19 is provided to the bottom wall 14 of the process chamber 10. Further, the discharge openings 19 are provided to the bottom wall 14 of the process chamber 10.

Accordingly, the discharge connections 18, 19 and discharge openings 19 provided below the processing unit 30, 60, 65 or the substrate support 60 enables subjecting the discharge suction force to the back surface 63' and to the lower surface of the substrates via the substrate holders 61, 62 and through holes thereof.

Figure 6:
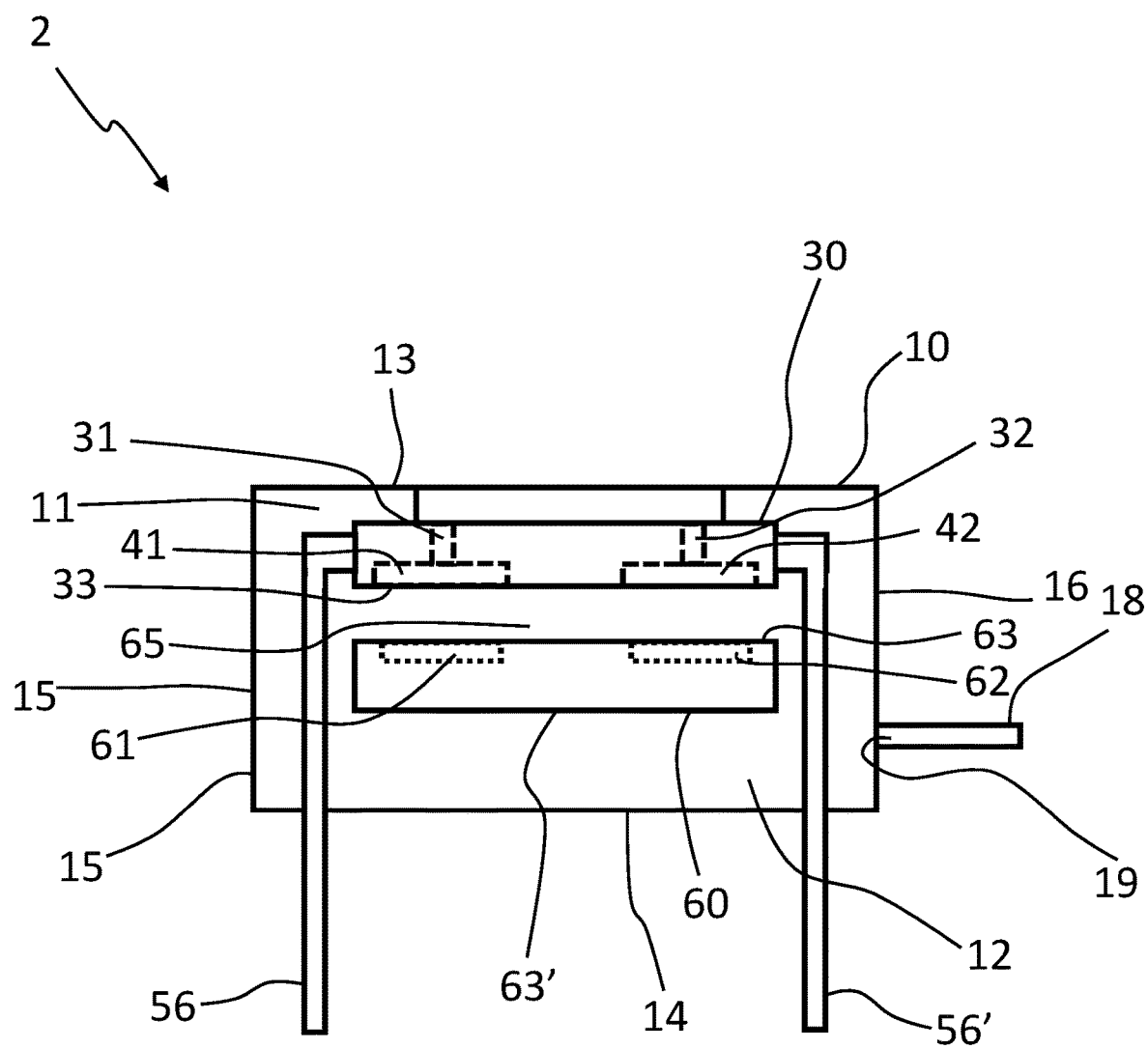

FIG. 6 shows a further alternative embodiment, in which the discharge connection 18, 19 is provided to the side wall 16 of the reaction chamber 10. The discharge conduit 18 is arranged to extend between the suction device 17 and process chamber 10.

The discharge connection 18, 19 and the discharge opening 19 are open to the process chamber space 11 of the process chamber 10.

In the embodiment of FIG. 6, the discharge connection 18, 19 is provided to the side wall 16 and open to the process chamber space 11 and the intermediate space 12 below the substrate processing unit 30, 60, 65. Further, the discharge opening 19 is provided to the side wall 16 below the substrate processing unit 30, 60, 65.

The discharge connection 18, 19 or the discharge opening 19 is arranged below the substrate support 60 in the processing position of the substrate support 60.

Further, the discharge connection 18, 19 is open to the process chamber space 11 and the intermediate space 12, and in vertical direction below the substrate support 60 in the process chamber space 11. Further, the discharge opening 19 is provided to the side wall 16 in vertical direction below the substrate support 60 in the process chamber space 11.

As shown in FIG. 6, the discharge connection 18, 19 is provided to the side wall 16 of the process chamber 10. Further, the discharge opening 19 is provided to the side wall 16 of the process chamber 10.

Accordingly, the discharge connection 18, 19 and discharge opening 19 provided below the processing unit 30, 60, 65 or the substrate support 60 enables subjecting the discharge suction force to the back surface 63' and to the lower surface of the substrates via the substrate holders 61, 62 and through holes thereof.

Is should be noted, that in alternative embodiment, the discharge connection 18, 19 or the discharge opening 19 is provided to the side wall 16 and open to the process chamber space 11 and the intermediate space 12 in vertical direction at the level of the substrate processing unit 30, 60, 65 or above the substrate processing unit 30, 60, 65. Further, the discharge opening 19 may be provided to the side wall 16 above the substrate processing unit 30, 60, 65 or in vertical direction at the level of the substrate processing unit 30, 60, 65.

The discharge connection 18, 19 or the discharge opening 19 may be arranged above or in vertical direction at the level the substrate support 60 in the processing position of the substrate support 60.

In a further alternative embodiment, the discharge connection or connections 18, 19 are provided to the top wall 13 of the process chamber. Therefore, the discharge connection 18, 19 or the discharge opening 19 is provided to the top wall 13 and open to the process chamber space 11 and the intermediate space 12 above the substrate processing unit 30, 60, 65 or the substrate support 60. Further, the discharge opening 19 is provided to the top wall 13 above the substrate processing unit 30, 60, 65 or the substrate support 60. The discharge connection 18, 19 or the discharge opening 19 are thus arranged above the substrate support 60 in the processing position of the substrate support 60.

Figure 7:
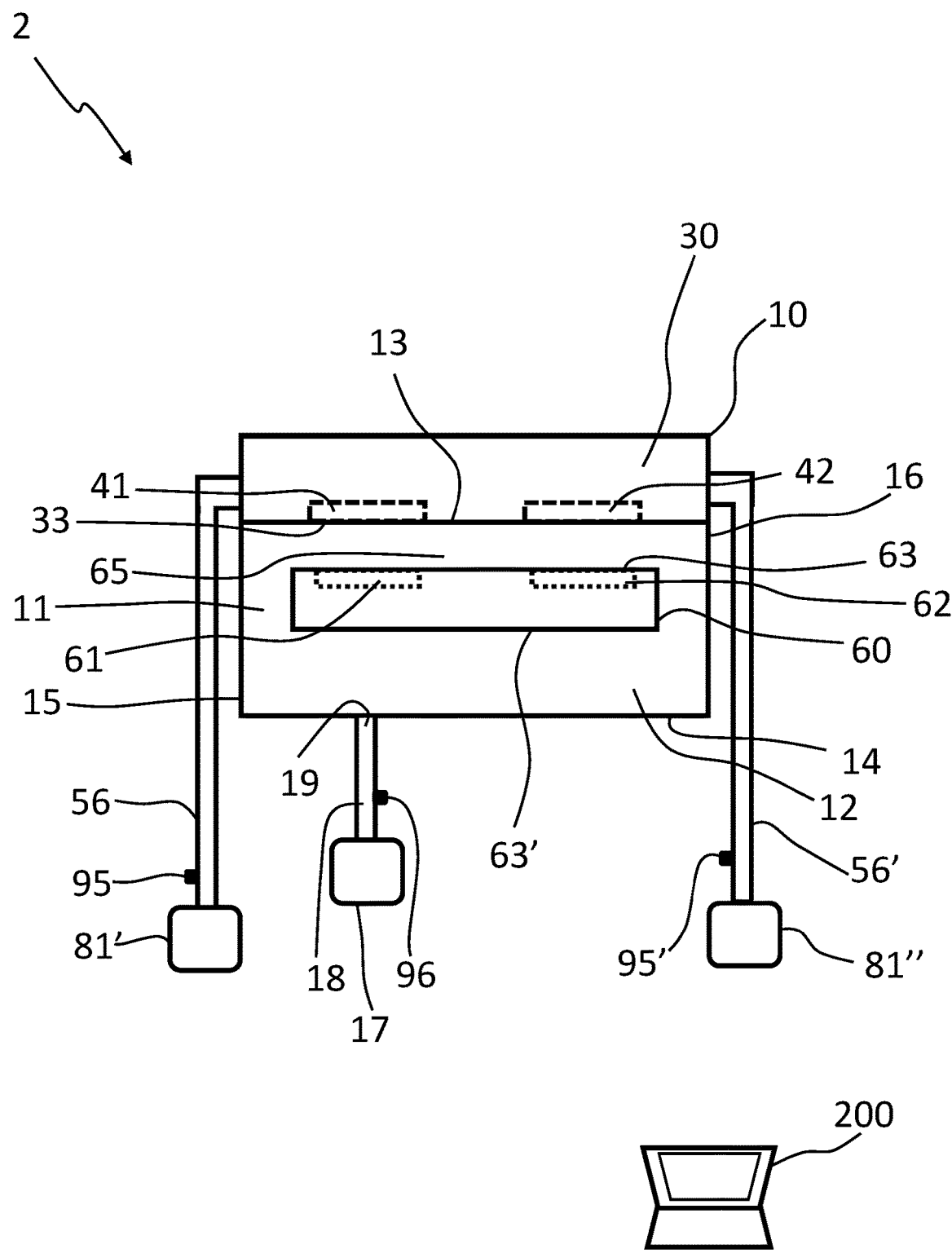

FIG. 7 shows an embodiment, in which the precursor supply head 30 is arranged to form the top wall 13 of the process chamber 10. Thus, the precursor supply head 30 is not arranged inside the process chamber space 11, but it forms the top wall 13 of the process chamber 10.

Accordingly, the output face 33 of the precursor supply head 30 forms the top wall 13 of the process chamber 10.

Further it should be noted that in an alternative embodiment the output face 33 of the precursor supply head 30 is arranged to form part of the top wall 13 of the process chamber 10.

The reaction gap 65 is provided between the top wall 13, or the output face 33.

In this embodiment, the precursor supply head 30 comprises the first gas distribution element 41 and the first reaction zone 44. The first suction zone is provided to the first gas distribution element 41 and the first reaction zone 44. Further, the first suction conduit 56 is arranged to extend form the first suction zone, or the first gas distribution element 41 and the first reaction zone 44 to a first suction device 81'. The first suction device 81' is arranged outside the process chamber 10 and the first suction conduit 56 extends from the precursor supply head 30 and the from the first gas distribution element 41 through the bottom wall 14 of the process chamber 10 to the first suction devices 81'.

Further, precursor supply head 30 comprises the second gas distribution element 42 and the second reaction zone 44'. A second suction zone is provided to the second gas distribution element 42 and the second reaction zone 44'. Further, the second suction conduit 56' is arranged to extend form the second suction zone, or the second gas distribution element 42 and the second reaction zone 44' to a second suction device 81". The second suction device 81" is arranged outside the process chamber 10 and the second suction conduit 56' extends from the precursor supply head 30 and the from the second gas distribution element 42 through the bottom wall 14 of the process chamber 10 to the second suction devices 81".

The discharge connection 18, 19 is connected to a separate discharge device 17. The discharge device 17 may be similar or corresponding suction device as the first and second suction devices 81', 81". The discharge connection 18, 19 and the discharge opening 19 are open to the process chamber space 11 of the process chamber 10.

In the embodiment of FIG. 7, the discharge connection 18, 19 is provided to the bottom wall 14 of the process chamber 10. Further, the discharge opening 19 is provided to the bottom wall 14 of the process chamber 10.

In alternative embodiments, the discharge connection 18, 19 and the discharge opening 19 is arranged to other walls of the process chamber 10, such as the side walls 15, 16 or the top wall 13.

The suction connections 56, 56' comprise suction conduits 56, 56' extending from the precursor supply head 30, and the gas distribution elements 41, 42, or the reaction zones 44, 44' thereof. The suction conduits 56, 56' are further connected to the suction devices 81, 81'.

The suction conduits 56, 56' extend from the precursor supply head 30 and out of the process chamber 10. As shown in FIG. 1, the suction devices 81, 81' are arranged outside the process chamber 10. The suction conduits 56, 56' extend between the suction devices 81, 81' and the precursor supply head 30. Accordingly, the suction conduits 56, 56' extend from outside the process chamber 10 through the chamber walls into the process chamber 10 and further to the precursor supply head 30.

In the embodiment of FIG. 1, each gas distribution element 41, 42, or reaction zone 44, 44' thereof, comprises a separate suction connection 56, 56' or suction conduit 56, 56', respectively. Further, each gas distribution element 41, 42, or reaction zone 44, 44' thereof, comprises separate suction device 81, 81' connected to a respective suction connection 56, 56' or suction conduit 56, 56'.

The suction conduits 56, 56' are arranged to extend into the process chamber space 11 through the bottom wall 14 of the process chamber 10 in the embodiment of FIG. 1. Accordingly, the suction devices 81, 81' are arranged outside the process chamber 10 and the suction conduits 56, 56' extend from the precursor supply head 30 through the bottom wall 14 of the process chamber 10 to the suction devices 81, 81'.

In alternative embodiment, the suction conduits 56, 56' are provided to other walls of the process chamber 10, such as the side walls 15, 16 or the top wall 13.

In the embodiment of FIG. 7, each gas distribution element 41, 42, or reaction zone 44, 44' thereof, comprises a separate suction connection 56, 56' or suction conduit 56, 56', respectively. Further, each gas distribution element 41, 42, or reaction zone 44, 44' thereof, comprises separate suction device 81', 81" connected to a respective suction connection 56, 56' or suction conduit 56, 56'.

As shown in FIG. 7, the suction connections 56, 56' are connected directly to the precursor supply head 30 from outside the process chamber 10. Therefore, the suction conduits 56, 56' extending from the precursor supply head 30 to the suction devices 81', 81".

The suction conduits 56, 56' extend outside the process chamber 10 between the precursor supply head 30 and the suction devices 81', 81". As shown in FIG. 7, the suction devices 81', 81" are arranged outside the process chamber 10. Thus, no lead-through to the process chamber 10 is needed for suction connections 56, 56'.

The first suction connection or the first suction conduit 56 is provided with the first suction pressure sensor 95 for measuring suction via the first suction zone or the first gas distribution element 41. The suction via the first gas distribution element 41 and the first suction connection 56 is generated by the first suction device 81'. Similarly, the second suction connection or the second suction conduit 56' is provided with the second suction pressure sensor 95' for measuring suction via the second suction zone or the second gas distribution element 42. The suction via the second gas distribution element 42 and the second suction connection 56' is generated by the second suction device 81". Further, the discharge connection 18, 19 is provided the discharge pressure sensor 96 for measuring discharge via the discharge connection 18, 19. The discharge via the discharge connection 18, 19 is generated by the discharge device 17.

The apparatus 2 may further comprises the control unit 200. The control unit 200 is arranged to control operation of the suction devices 81', 81" and the discharge device 17.

Accordingly, the control unit 200 is arranged to adjust first and second suction devices 81', 81" and the discharge device 17 based on predetermined control criteria for providing desired suction forces via the first and second suction zones of the first and second gas distribution element 41, 42, respectively, and via the discharge connection 18, 19.

The sensors 95, 95' and 96 are used for controlling the operation of the suction devices 81', 81" and discharge device 17, respectively, with the control unit 200.

Figure 8:
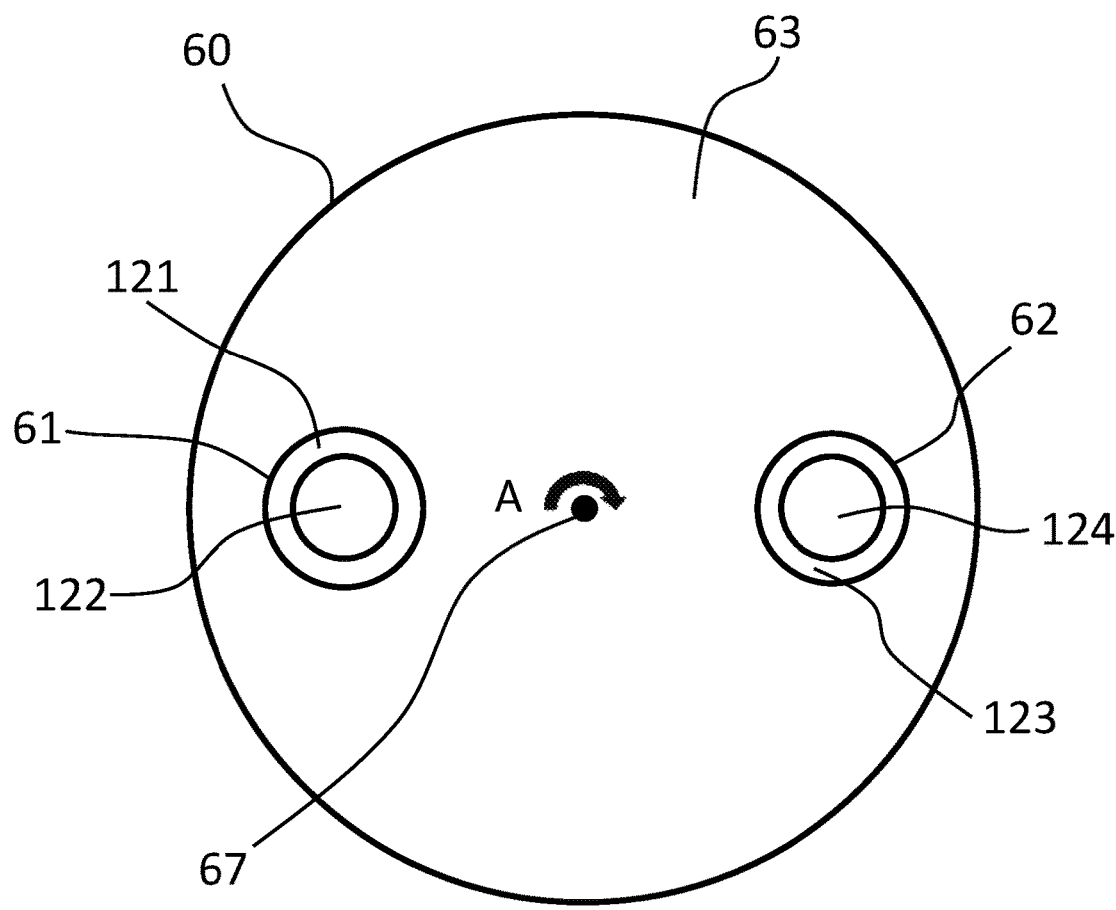
FIG. 8 shows a schematic top view of a substrate support.
Figure 9:
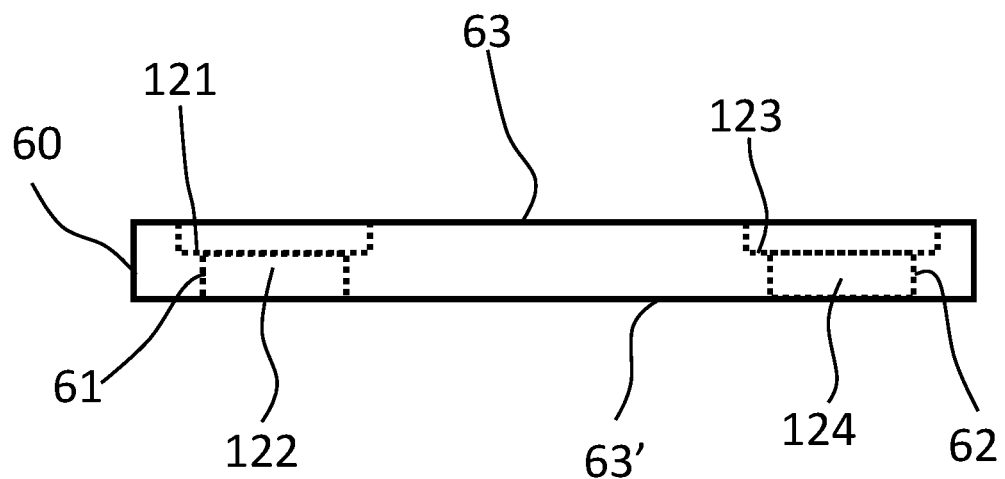
FIG. 9 shows a schematic side view of the support of FIG. 8.

FIGS. 8 and 9 show schematically the substrate support 60.

FIG. 8 shows a top view of one embodiment of the substrate support 60. The substrate support 60 and the support surface 63 has a support centre point 67 or support central axis 67. The support centre point 67 is the centre point of the circular support surface 63.

The rotating axis 66 may be connected to the substrate support 60 at the support centre point 67 or along the support central axis 67. Thus, the substrate support 60 and the support surface 63 are rotated in the rotation direction A around the rotation axis 66 and the support centre point 67 or the support central axis 67.

The substrate support 60 comprises two substrate holders 61, 62 provided on the support surface 63 for holding two substrates. Each of the substrate holders 61, 62 are arranged to receive and hold one substrate. The substrate support 60 comprises one or more substrate holders 61, 62.

The substrate holders 62 are arranged to the support surface 63 opposite to each other on opposite sides of the support centre point 67.

The substrate holders 61, 62 are arranged successively or adjacent to each other in the rotation direction A. Thus, the substrate holders 62 are at the same distance from the support centre point 67.

The substrate holders 61, 62 comprise a through hole 122, 124 extending between the support surface 63, or the upper surface of the substrate support 60, and the back surface 63', lower surface, of the substrate support 60.

FIG. 9 shows a side of the substrate support 60 of FIG. 8. The substrate holders 61, 62 are formed as substrate holder recesses provided on the support surface 63 for receiving one or more substrates, respectively. The substrate holders 61, 62 further comprise a holder surface 121, 123 against which the substrate is supported in the substrate holder recess 61, 62. The holder surface 121, 123 is below the support surface 63 towards the back surface 63' such that the substrate holder recess is formed.

The holder surface 121, 123 is parallel to support surface 63.

The through holes 122, 124 are provided in the middle of the holder surface 121, 123 such that the holder surface 121, 123 forms an edge surface surrounding the through hole 122, 124. Further, the through hole 122, 124 extends form the holder surface 121, 123 to the back surface 63' of the substrate support 60.

The one or more through holes 122, 124 extend between the support surface 63 and the back surface 63' of the substrate support 60. The one or more through holes 122, 124 are open to the support surface 63 and to the reaction gap 65 between the support surface 63 and the output face 33. The one or more through holes 122, 124 are open to the intermediate chamber space 12, or to the process chamber space 11.

The one or more through holes 122, 124 extend between the reaction gap 65 and the process chamber space 11 or the intermediate chamber space 12.

Accordingly, the substrate holder recesses 61, 62 are arranged receive the substrate such that the upper surface of the substrate is facing towards the output face 33 of the precursor supply head 30 and the substrate is against the holder surface 121, 123.

Further, the upper surface of the substrate is preferably parallel to the support surface 63 and the output face 33. In further preferable embodiment, upper surface of the substrate is preferably parallel to the support surface 63 and the output face 33 and flush with support surface 63.

Figure 10:
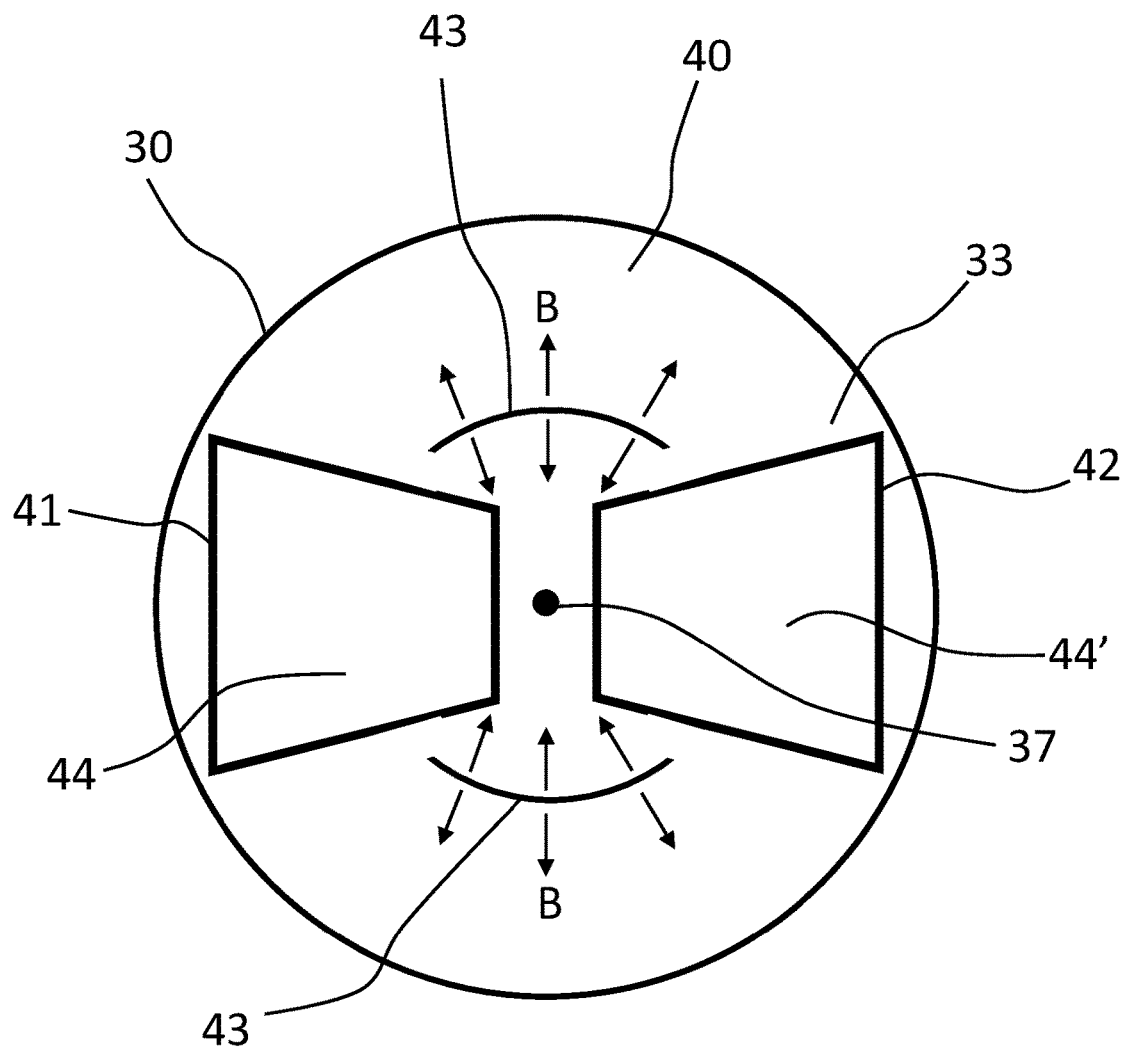
FIG. 10 shows a schematic top view of one embodiment of a precursor supply head.

FIG. 10 shows one embodiment of the precursor supply head 30 and the output face 33 thereof. The precursor supply head 30 and the output face 33 has a head centre point 37 or head central axis 37. The head centre point 37 is the centre point of the circular output face 33.

The output face 33 is provided with two gas distribution elements 41, 42 via which precursors are supplied. The two gas distribution elements 41, 42 provide two reaction zones 44, 44', respectively.

In one embodiment, a first gas distribution element 41 and a first reaction zone 44 is arranged to supply a first precursor. Similarly, a second gas distribution element 42 and a second reaction zone 44' is arranged to supply a second precursor.

The first and second gas distribution elements 41, 42, and the first and second reaction zones 44, 44', respectively, are provided symmetrically relative to each other on the output face 33. The first and second gas distribution elements 41, 42 are arranged to the output face 33 opposite to each other on opposite sides of the head centre point 37. The gas distribution elements 40, 40' are arranged successively or adjacent to each other in the rotation direction A.

In alternative embodiments, there may be one or more gas distribution elements 41, 42. Preferably, there are two or more gas distribution elements 41, 42 arranged symmetrically relative to each other and the head centre point 37.

The precursor supply head 30 comprises intermediate purge gas feeding nozzles 43 arranged to the output face 33 adjacent the gas distribution elements 41, 42 or the reaction zones 44, 44'.

Accordingly, intermediate purge gas feeding nozzles 43 are arranged adjacent each of the gas distribution elements 41, 42 or the reaction zones 44, 44'. on opposite sides of the gas distribution elements 41, 42 or the reaction zones 44, 44', as shown in FIG. 10. Further, intermediate purge gas feeding nozzles 43 are arranged between adjacent gas distribution elements 41, 42 or reaction zones 44, 44'. The term adjacent in connection with the intermediate purge gas nozzles 43 means adjacent the gas distribution element 41, 42 or the reaction zone 44, 44' in the rotation direction A on the output face 33 in the rotation direction A around the head centre point 37. The term between in connection with the intermediate purge gas nozzles 43 means between two gas distribution elements 41,42 or two reaction zones 44, 44' in the rotation direction A on the output face 33.

In the embodiment of FIG. 10, the intermediate purge gas feeding nozzles 43 have a longitudinal curved form and are arranged to extend between the adjacent reaction zones 44, 44'. Furthermore, the intermediate purge gas feeding nozzles 43 are arranged to extend in the rotation direction A around the head centre point 37.

The purge gas flow B is directed in radial direction of the rotation direction A or in radial direction of the head centre point, as shown in FIG. 10. This provides transversal purge gas flow between the adjacent gas distribution elements 41, 42 or adjacent reaction zones 44, 44'.

The curved intermediate purge gas feeding nozzles 42 may be replaced by longitudinal linear intermediate purge gas feeding nozzles 43 extending in a direction between adjacent the adjacent gas distribution elements 41, 42 or adjacent reaction zones 44, 44'. Alternatively, the intermediate purge gas feeding nozzles 43 of FIG. 10 may be curved in alternative manner between adjacent the adjacent gas distribution elements 41, 42 or adjacent reaction zones 44, 44'.

Further alternatively, the longitudinal intermediate purge gas feeding nozzles 43 may be arranged on the output face 33 and to extend in a direction away from the head centre point 37 of the precursor supply head 30. The longitudinal intermediate purge gas feeding nozzles 43 are thus arranged to extend radially in a direction away from the head centre point 37 of the precursor supply head 30. The longitudinal intermediate purge gas feeding nozzles 43 are arranged between adjacent the adjacent gas distribution elements 41, 42 or adjacent reaction zones 44, 44' in the rotation direction A.

Figure 11:
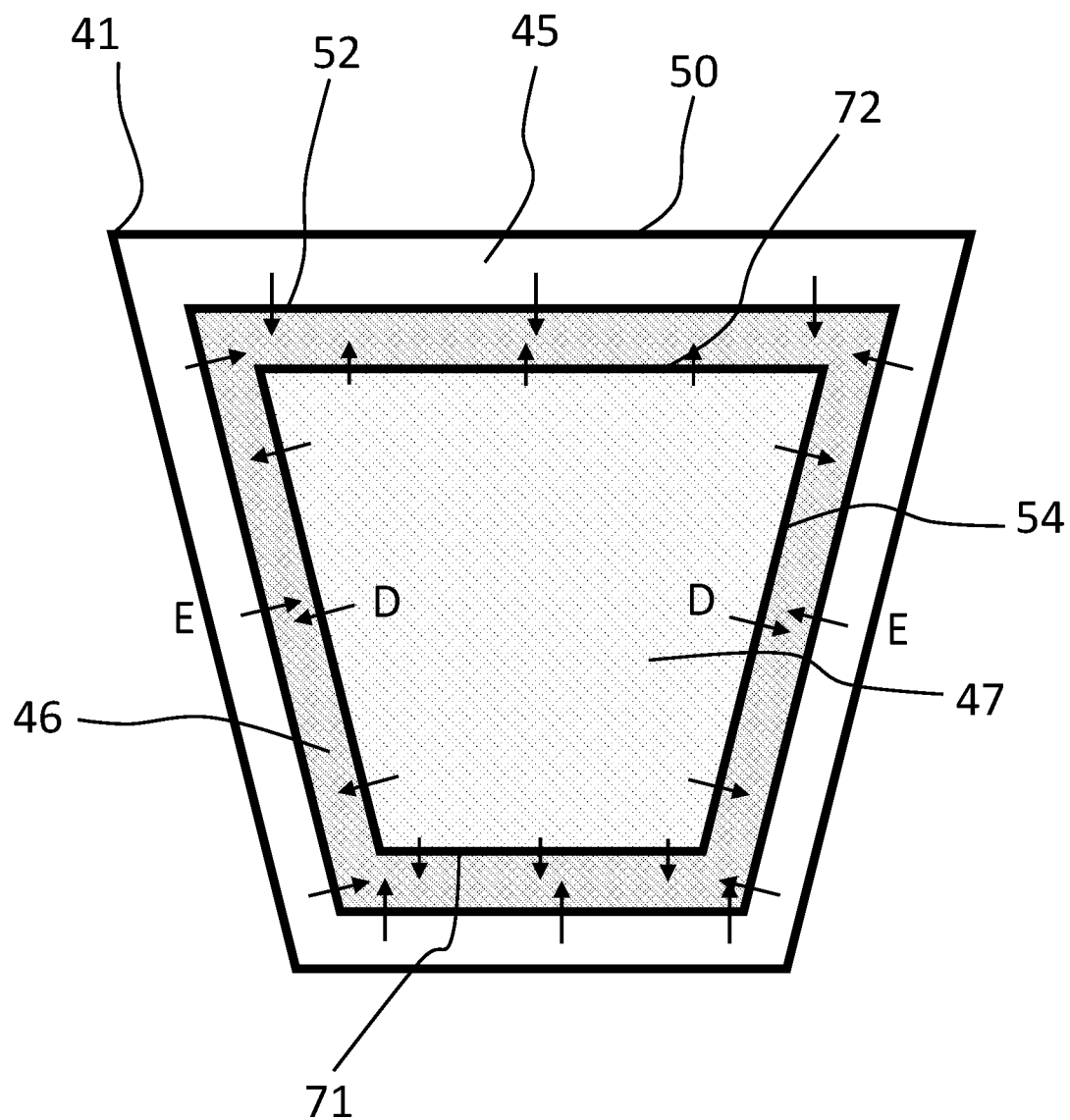
FIG. 11 shows a schematic view of one embodiment of a reaction zone according to the present invention.
Figure 12:
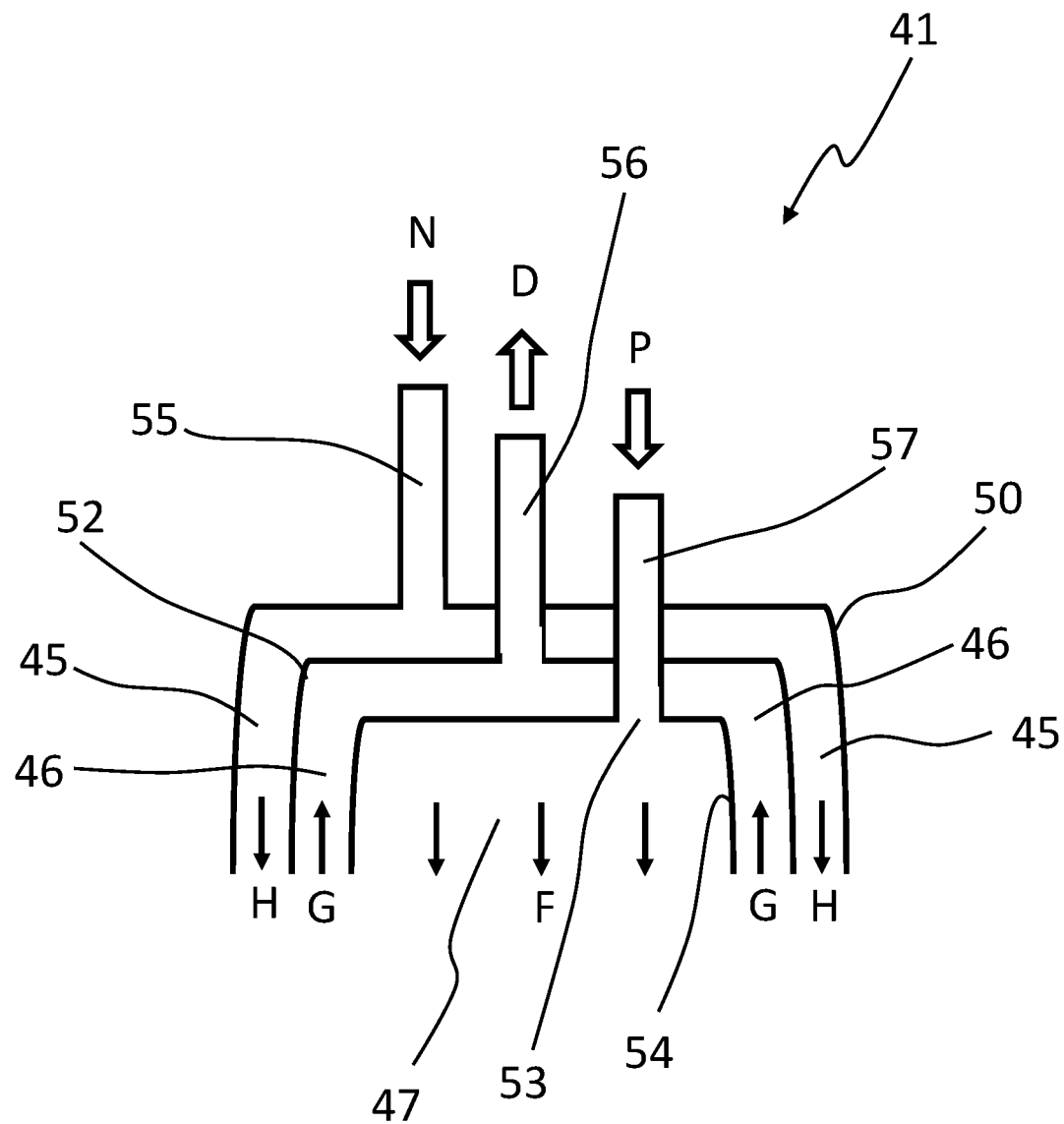
FIG. 12 shows a schematic cross-sectional side view of one embodiment of the reaction zone.

FIG. 11 shows schematically one embodiment of a gas distribution element 41 or a reaction zone 44.

The gas distribution element 41 or the reaction zone 44, 44' comprises a precursor supply zone 47 open to the output face 33 of the precursor supply head 30 for supplying precursor.

The precursor supply zone 47 of the gas distribution element 41 is provided by a precursor supply nozzle 54.

The precursor supply zone 47 is formed as a precursor supply area and arranged as a central area of the reaction zone 44 or the gas distribution element 41.

Further, the precursor supply nozzle 54 is arranged to provide a central nozzle of the gas distribution element 41.

The gas distribution element 41 or the reaction zone 44 further comprises a suction zone 46 open to the output face 33 of the precursor supply head 30. The suction zone 46 and arranged to surround the precursor supply zone 47 at the output face 33 of the precursor supply head 30.

The suction zone 46 of the gas distribution element 41 is provided by a suction nozzle 52. The suction nozzle 52 is arranged to surround the precursor supply nozzle 54 in the gas distribution element 41 and on the output surface 33.

Accordingly, the suction zone 46 is arranged to surround the precursor supply zone 47 circumferentially in the reaction zone 44 and on the output face 33.

Similarly, the suction nozzle 52 is arranged surround the precursor supply nozzle 54 circumferentially in the gas distribution element 41 and on the output surface 33.

Therefore, the suction zone 46 and the suction nozzle 52 surround the precursor supply zone 47 and the precursor supply nozzle 54, respectively, from all directions on the output face 33.

As shown in FIG. 11, precursor supplied from the precursor supply zone 47 and the precursor supply nozzle 54 flows from the precursor supply zone 47 towards the suction zone 46 as indicated by arrows D. Thus, precursor is prevented from escaping away from the reaction zone 44 and from the gas distribution element 41 to surroundings.

In preferred embodiments, the gas distribution element 41 or the reaction zone 44 further comprises a purge gas supply zone 45 open to the output face 33 of the precursor supply head 30. The purge gas supply zone 45 is arranged to surround the suction zone 46 and the precursor supply zone 47 at the output face 33 of the precursor supply head 30. Accordingly, the suction zone 46 is provided between the precursor supply zone 47 and the purge gas supply zone 45 at the output face 33 of the precursor supply head 30.

The purge gas supply zone 45 of the gas distribution element 41 is provided by a purge gas supply nozzle 50. The purge gas supply nozzle 50 is arranged to surround the suction nozzle 52 in the gas distribution element 41 and on the output surface 33.

Accordingly, the purge gas supply zone 45 is arranged to surround the suction zone 46 circumferentially in the reaction zone 44 and on the output face 33.

Similarly, the purge gas supply nozzle 50 is arranged surround the suction nozzle 52 circumferentially in the gas distribution element 41 and on the output surface 33.

Therefore, the purge gas supply zone 45 and the purge gas supply nozzle 50 surround the suction zone 466 and the suction nozzle 52, respectively, from all directions on the output face 33.

As shown in FIG. 11, purge gas supplied from the purge gas supply zone 45 and the purge gas supply nozzle 50 flows from the purge gas supply zone 45 towards the suction zone 46 as indicated by arrows E.

The purge gas flow direction E is opposite to the precursor flow direction D. Thus, precursor is efficiently prevented from escaping away from the reaction zone 44 and from the gas distribution element 41 to surroundings.

According to the above mentioned, the suction zone 46 is provided between the precursor supply zone 47 and the purge gas supply zone 45 in the reaction zone 44 on the output face 33. Further, the suction nozzle 52 is arranged between the precursor supply nozzle 54 and the purge gas supply nozzle 50 in the gas distribution element 41 on the output face 33.

FIG. 10 shows an embodiment, in which a precursor distribution element 58 provided to the precursor supply zone 47 and to the precursor supply nozzle 54. The precursor distribution element 58 is connected to the precursor supply channel 57 for receiving precursor P form the precursor source. The precursor distribution element 58 comprises one or more precursor distribution openings 59 open to precursor supply nozzle 54 and the precursor supply zone 47. Preferably, the precursor distribution element 58 comprises two or more precursor distribution openings 59 open to precursor supply nozzle 54 and the precursor supply zone 47 for distributing the precursor over the area of the precursor supply zone 47. Accordingly, the precursor distribution element 58 covers the precursor supply zone 47 for distributing the precursor over the area of the precursor supply zone 47.

Figure 13:
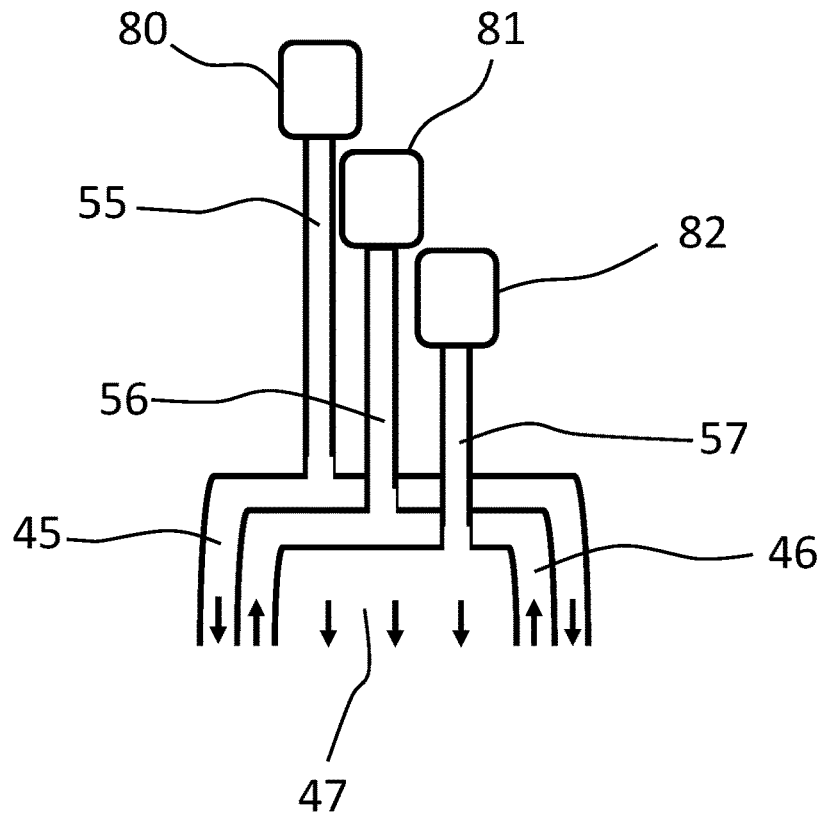
FIGS. 13 and 14 show schematically cross-sectional side views of first and second reaction zones.
Figure 14:
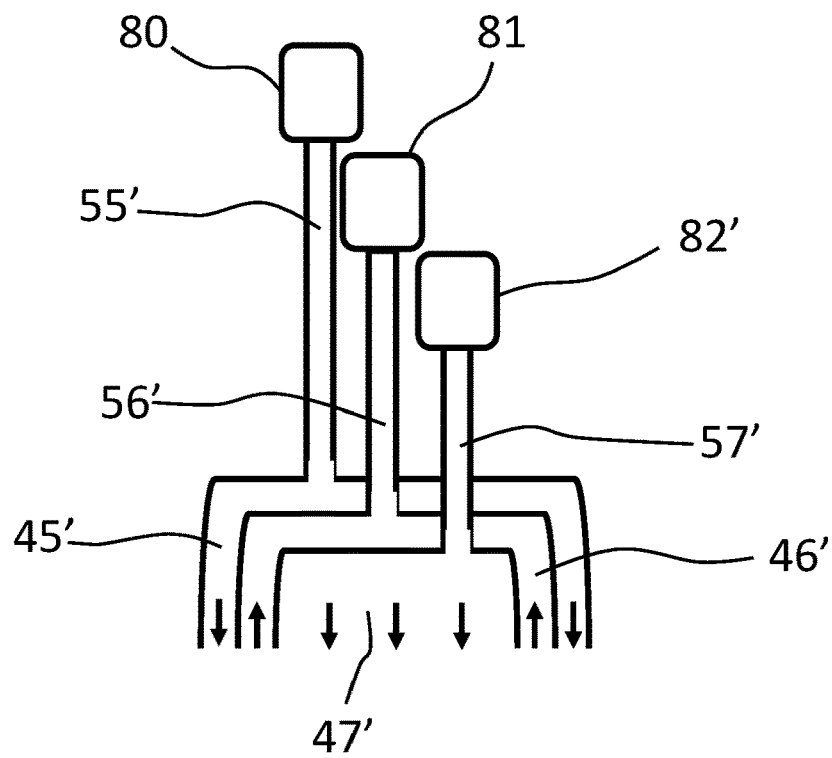

FIGS. 13 and 14 shows a first gas distribution element 41 and a second gas distribution element 42, respectively. The first and second gas distribution elements 41, 42 of FIGS. 13 and 14 correspond the first and second gas distribution elements 41, 42 of FIG. 10.

A first precursor source 82 comprising first precursor is connected to the first precursor supply area 47 or the first purge gas supply nozzle of the first gas distribution element 41 via the first precursor supply channel 57. The suction device 81 is connected to the first suction zone 46 or the first suction nozzle of the first gas distribution element 41 via the first suction channel 56. A first purge gas source 80 is connected to the first purge gas supply area 45 or the first purge gas supply nozzle of the first gas distribution element 41 via the first purge gas supply channel 55.

The first precursor source 82 and the first purge gas source 80 are provided to the precursor supply system 20 of the apparatus 2.

The first precursor supply channel 57, and the first purge gas supply channel 55 represent or are comprised in the conduits 22 and the channels 32 of FIGS. 1, 2 and 3.

A second precursor source 82' comprising second precursor is connected to the second precursor supply area 47' or the second purge gas supply nozzle of the second gas distribution element 42 via the second precursor supply channel 57'. The suction device 81 is connected to the second suction zone 46' or the second suction nozzle of the second gas distribution element 42 via the second suction channel 56'. A second purge gas source 80' is connected to the second purge gas supply area 45' or the second purge gas supply nozzle of the second gas distribution element 42 via the second purge gas supply channel 55'.

The second precursor source 82' and the second purge gas source 80' are provided to the precursor supply system 20 of the apparatus 2.

The second precursor supply channel 57' and the second purge gas supply channel 55' represent or are comprised in the conduits 22 and the channels 32 of FIGS. 1, 2 and 3.

Further, the first and second purge gas sources 80, 80' may be provided as one common purge gas source. The same purge gas source may be also connected to the intermedia purge gas supply nozzles 43.

The present invention provides a method for processing a surface of a substrate successively with a first precursor and a second precursor according to principles of atomic layer deposition. The method being carried out with an atomic layer deposition apparatus 2 as described above.

The method comprises supporting the substrate in the substrate holder 61, 62, supplying precursor via the at least one reaction zone 44, 44' to the reaction gap 65, and rotating the substrate support 60 and the precursor supply head 30 relative to each other with the moving mechanism 64, 66 such that the reaction gap 65 is maintained constant for subjecting the surface of the substrate to the precursor. The method further comprises discharging gases from the reaction gap 65 by providing a suction underpressure to the reaction gap 65 via the suction zone 46 of the at least one reaction zone 44, 44', and discharging gases from the chamber space 11 of the process chamber 10 outside the reaction gap 65 by providing a discharge underpressure to the chamber space 11 via the discharge connection 18, 19. The pressure in the chamber space 11 provided by the discharge underpressure being lower than the pressure in the reaction gap 65 provided by the suction underpressure.

In one embodiment, the atomic layer deposition apparatus comprises a first reaction zone 44 provided with a first suction zone 46 and the suction device 81 connected to the first suction zone 46 of the first reaction zone 41, and a second reaction zone 44' provided with a second suction zone 46' and the suction device 81 connected to the second suction zone 46' of the second reaction zone 42. The method comprises supplying the first precursor via the first reaction zone 44 to the reaction gap 65, and discharging gases from the reaction gap 65 by providing a first suction underpressure to the reaction gap 65 with the suction device 81 via the first suction zone 46 of the first reaction zone 44. The method also comprises supplying the second precursor via the second reaction zone 44' to the reaction gap 65, and discharging gases from the reaction gap 65 by providing a second suction underpressure to the reaction gap 65 with the suction device 81 via the second suction zone 46' of the second reaction zone 44'. The method further comprises discharging gases from the chamber space 11 of the process chamber 10 outside the reaction gap 65 by providing a discharge underpressure to the reaction space 11 via the discharge connection 18, 19 with the suction device 81.

The method further comprises setting or adjusting the discharge underpressure with the discharge control valve 94 and the first and/or second suction underpressure with the first and second suction control valves 93, 93' such that discharge underpressure in the chamber space 11 outside the reaction gap 65 is greater than the suction underpressure in the reaction gap 65. a Furthermore, the method may also comprise measuring the discharge underpressure with the discharge pressure sensor 92 in the chamber space 11 outside the reaction gap 65 and the suction underpressure with the suction pressure sensor 91 in the reaction gap 65. Adjusting the discharge underpressure in the chamber space 11 and in the suction underpressure in the reaction gap 65 is carried out by utilizing the measurement results of the pressure sensors 91, 92.

It should be noted, that the apparatus may also be provided with separate suction devices 81', 81" and the discharge device 17, as in the FIG. 7.

The method further comprises setting or adjusting the discharge underpressure by the discharge device 17 to be greater than the first suction underpressure provided by the first suction device 81, and the second suction underpressure provided by the second suction device 81'.

Furthermore, the method may also comprise measuring the discharge underpressure with the discharge pressure sensor 92, measuring the first suction underpressure with the first suction pressure sensor 91 and the second suction pressure with the second suction pressure sensor 91'. Adjusting the discharge underpressure, the first suction underpressure and the second suction underpressure is carried out by utilizing the measurement results of the pressure sensors 91, 91', 92.

The invention has been described above with reference to the examples shown in the figures. However, the invention is in no way restricted to the above examples but may vary within the scope of the claims.

The invention claimed is:

1. An atomic layer deposition apparatus for processing a surface of a substrate successively with at least a first precursor and a second precursor according to principles of atomic layer deposition, the apparatus comprising:
    a substrate support having a support surface, the support surface being provided with one or more substrate holders for supporting one or more substrates; and
    a precursor supply head having an output face, the output face being provided with at least one reaction zone comprising a precursor supply zone open to the output face of the precursor supply head and arranged to supply precursor;
    the support surface of the substrate support and the output face of the precursor supply head being arranged opposite to each other to a process position such that a reaction gap is provided between the support surface of the substrate support and the output face of the precursor supply head;
    a moving mechanism, in the process position, the substrate support and the precursor supply head are arranged to be rotated relative to each other with the moving mechanism such that the support surface of the substrate support and the output face of the precursor supply head are arranged to be rotated relative to each other; and
    a process chamber having chamber walls forming a chamber space inside the process chamber, the substrate support and the precursor supply head being arranged inside the process chamber, wherein:
    the substrate support comprises a back surface opposite the support surface, and the one or more substrate holders comprising a through hole extending through the substrate support between the back surface and the support surface;
    the at least one reaction zone of the precursor supply head further comprises a suction zone open to the output face of the precursor supply head for discharging gases from the reaction gap between the support surface of the substrate support and the output face of the precursor supply head; and
    the process chamber is provided with a discharge connection open to the chamber space for discharging gases from the chamber space of the process chamber, wherein, in the process position, the through hole of at least one of the one or more substrate holders is open to the support surface and to the reaction gap between the support surface and the output face, and is open to the chamber space inside the process chamber, and
    wherein the discharge connection is arranged to provide underpressure to the chamber space and to direct a discharge force via the through hole of at least one of the one or more substrate holders to a lower surface of a substrate supported on the support surface of the substrate support.

2. The atomic layer deposition apparatus according to the claim 1, wherein the substrate support comprises a back surface opposite the support surface, and the one or more substrate holders comprising a through hole extending through the substrate support between the back surface and the support surface.

3. The atomic layer deposition apparatus according to the claim 1, wherein:
the one or more substrate holders are formed as substrate holder recesses to the support surface; or
the one or more substrate holders are formed as substrate holder recesses to the support surface, and that the through hole is arranged to extend from the substrate holder recess to the back surface of the substrate holder.

4. The atomic layer deposition apparatus according to claim 1, wherein:
the suction zone is arranged to surround the precursor supply zone at the output face of the precursor supply head; or
the suction zone is arranged to surround the precursor supply zone circumferentially at the output face of the precursor supply head; or
the suction zone is provided as a suction slot arranged to surround the precursor supply zone circumferentially at the output face of the precursor supply head.

5. The atomic layer deposition apparatus according to claim 1, wherein the apparatus comprises a suction device connected to the suction zone of the at least one reaction zone, the suction device being arranged to provide suction to the reaction gap between the between the support surface of the substrate support and the output face of the precursor supply head.

6. The atomic layer deposition apparatus according to claim 1, wherein the apparatus comprises:
a first reaction zone provided with a first suction zone arranged to provide suction to the reaction gap between the between the support surface of the substrate support and the output face of the precursor supply head via the first reaction zone; and
a second reaction zone provided with a second suction zone arranged to provide suction to the reaction gap between the support surface of the substrate support and the output face of the precursor supply head via the second reaction zone.

7. The atomic layer deposition apparatus according to claim 1, wherein:
the reaction zone further comprises a purge gas supply zone open to the output face of the precursor supply head and arranged to surround the suction zone and the precursor supply zone circumferentially at the output face of the precursor supply head, the suction zone being arranged between the precursor supply zone and the purge gas supply zone at the output face of the precursor supply head; or
the reaction zone further comprises a purge gas supply zone open to the output face of the precursor supply head and formed as a purge gas slot, the purge gas supply zone being arranged to surround the suction zone and the precursor supply zone circumferentially at the output face of the precursor supply head, the suction zone being arranged between the precursor supply zone and the purge gas supply zone at the output face of the precursor supply head.

8. The atomic layer deposition apparatus according to claim 1, wherein:
the discharge connection is connected to a discharge device, the discharge device being arranged to provide suction to the chamber space of the process chamber via the discharge connection; or
the discharge connection is connected to a suction device, the suction device being arranged to provide suction to the chamber space of the process chamber via the discharge connection.

9. The atomic layer deposition apparatus according to claim 1, wherein:
the discharge connection is provided to the chamber walls of the process chamber and arranged open to the chamber space; or
the process chamber comprises a bottom wall and one or more side walls extending from the bottom wall, the discharge connection being provided to the bottom wall of the process chamber and arranged open to the chamber space; or
the process chamber comprises a bottom wall and one or more side walls extending from the bottom wall, the discharge connection being provided to one of the one or more side walls of the process chamber and arranged open to the chamber space.

10. The atomic layer deposition apparatus according to claim 1, wherein:
the substrate support is arranged in vertical direction below the precursor supply head in the process chamber, and the discharge connection is provided below the support surface of the substrate support inside the process chamber; or
the substrate support is arranged in vertical direction below the precursor supply head in the process chamber, and the discharge connection is provided to the bottom wall of the process chamber and below the support surface of the substrate support inside the process chamber; or
the substrate support is arranged in vertical direction below the precursor supply head in the process chamber, and the discharge connection is provided in vertical direction between the support surface of the substrate support and the bottom wall of the process chamber inside the process chamber.

11. The atomic layer deposition apparatus according to claim 1, wherein:
the discharge connection is open to the chamber space outside the reaction gap; or
the apparatus comprises a substrate processing unit, the substrate processing unit comprising the substrate support and the precursor supply head and the reaction gap between the support surface of the substrate support and the output face of the precursor supply head, the process chamber comprising an intermediate chamber space surrounding the substrate processing unit inside the chamber space of the process chamber, and the discharge connection is open to the intermediate chamber space; or
the apparatus comprises a substrate processing unit, the substrate processing unit comprising the substrate support and the precursor supply head and the reaction gap between the support surface of the substrate support and the output face of the precursor supply head, the process chamber comprising an intermediate chamber space surrounding the substrate processing unit inside the chamber space of the process chamber, and the discharge connection is open to the intermediate chamber space in vertical direction below the substrate processing unit.

12. The atomic layer deposition apparatus according to claim 1, wherein the apparatus further comprises:
a suction pressure sensor arranged in connection with the reaction gap for measuring pressure in the reaction gap between the support surface of the substrate support and the output face of the precursor supply head; and a discharge pressure sensor arranged in connection with the chamber space outside the reaction gap for measuring pressure in the chamber space outside the reaction gap.

13. The atomic layer deposition apparatus according to claim 1, wherein:

the moving mechanism is connected to the substrate support and arranged to rotate substrate support; or the moving mechanism is connected to the precursor supply head and arranged to rotate the precursor supply head.

14. The atomic layer deposition apparatus according to claim 1, wherein:

the moving mechanism is arranged to move the substrate support and the precursor supply head relative to each other in direction transverse to the support surface of the substrate support such that the reaction gap between the support surface and the output surface is adjusted; or the moving mechanism is arranged to move the substrate support in direction transverse to the support surface of the substrate support such that the reaction gap between the support surface and the output surface is adjusted; or the moving mechanism is arranged to move the precursor supply head in direction transverse to the support surface of the substrate support such that the reaction gap between the support surface and the output surface is adjusted.

15. The atomic layer deposition apparatus according to claim 1, wherein, in the process position, the through hole of each of the one or more substrate holders is open to the support surface and to the reaction gap between the support surface and the output face, and is open to the chamber space inside the process chamber, and wherein the discharge connection is arranged to provide underpressure to the chamber space and to direct the discharge force via the through hole of each of the one or more substrate holders to the lower surface of the substrate supported on the support surface of the substrate support.

16. The atomic layer deposition apparatus according to claim 1, wherein the one or more substrate holders include a total of at least two through holes which extend through the substrate support between the back surface and the support surface, which are open to the support surface and to the reaction gap between the support surface and the output face, and which are open to the chamber space inside the process chamber.

* * * * *